(12) United States Patent
Voinigescu et al.

(10) Patent No.: US 10,037,815 B2
(45) Date of Patent: Jul. 31, 2018

(54) ANALOG-TO-DIGITAL CONVERTERS

(71) Applicant: Finisar Corporation, Sunnyvale, CA (US)

(72) Inventors: Sorin Petre Voinigescu, Scarborough (CA); Konstantinos Vasilakopoulos, Toronto (CA); Eran Socher, Toronto (CA)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 15/601,805

(22) Filed: May 22, 2017

(65) Prior Publication Data

US 2017/0338832 A1 Nov. 23, 2017

Related U.S. Application Data

(60) Provisional application No. 62/339,327, filed on May 20, 2016.

(51) Int. Cl.
| | |
|---|---|
| H03M 1/12 | (2006.01) |
| G11C 27/02 | (2006.01) |
| H03M 1/00 | (2006.01) |
| H03M 1/06 | (2006.01) |
| H03M 1/46 | (2006.01) |
| H03M 1/78 | (2006.01) |

(52) U.S. Cl.
CPC ......... G11C 27/026 (2013.01); H03M 1/1245 (2013.01); H03M 1/00 (2013.01); H03M 1/0624 (2013.01); H03M 1/12 (2013.01); H03M 1/1215 (2013.01); H03M 1/46 (2013.01); H03M 1/785 (2013.01)

(58) Field of Classification Search
CPC .................................. H03M 1/12; H03M 1/00
USPC ................................ 341/155, 120, 122, 156
See application file for complete search history.

(56) References Cited

U.S. PATENT DOCUMENTS

| | | | | |
|---|---|---|---|---|
| 5,258,721 A | * | 11/1993 | Zanders | ............... H04M 11/066 327/18 |
| 2013/0099948 A1 | * | 4/2013 | Dedic | .................... G11C 27/02 341/122 |

* cited by examiner

*Primary Examiner* — Joseph Lauture
(74) *Attorney, Agent, or Firm* — Maschoff Brennan

(57) ABSTRACT

An embodiment includes an analog-to-digital converter device. A device may include a first track and hold amplifier configured to receive an analog input signal. The device may also include a plurality of paths coupled to an output of the first track and hold amplifier. Each path of the plurality of paths includes a second track and hold amplifier coupled to the first track and hold amplifier, and a successive approximation register analog-to-digital converter coupled to an output of the second track and hold amplifier. The successive-approximation analog-to-digital converter may include heterojunction bipolar transistors, a comparator, R-2R DAC, and a SiGe BiCMOS quasi-CML SAR register and sequencer.

24 Claims, 22 Drawing Sheets

ANALOG-TO-DIGITAL CONVERTERS

CROSS REFERENCE TO RELATED APPLICATION

A claim for benefit of priority to the May 20, 2016 filing date of the U.S. Patent Provisional Application No. 62/339,327, titled "ANALOG-TO-DIGITAL CONVERTERS" (the '327 Provisional Application), is hereby made pursuant to 35 U.S.C. § 119(e). The entire disclosure of the '327 Provisional Application is hereby incorporated herein.

FIELD

The embodiments discussed herein are related to analog-to-digital converters.

BACKGROUND

Analog signals may be continuously variable and may represent any value in a continuous spectrum. Digital signals are not continuously variable, and include discrete values. Since the use of analog signals and the use of digital signals both have advantages depending on a particular function being performed, many circuits include analog components that process analog signals and digital components that process digital signals. To allow these analog and digital components to interact, digital signals may be converted to analog signals using digital-to-analog converters (DACs). Likewise, analog signals may be converted to digital signals using analog-to-digital converters (ADCs).

The subject matter claimed herein is not limited to embodiments that solve any disadvantages or that operate only in environments such as those described above. Rather, this background is only provided to illustrate one example technology area where some embodiments described herein may be practiced.

SUMMARY

An example embodiment includes an analog-to-digital converter device. The device may include a first track and hold amplifier configured to receive an analog input signal. The device may further include a plurality of paths coupled to an output of the first track and hold amplifier. Each path of the plurality of paths may include a second track and hold amplifier coupled to the first track and hold amplifier, and a successive approximation register analog-to-digital converter coupled to an output of the second track and hold amplifier.

Another example embodiment includes an optical receiver. The optical receiver may include a processor and an analog-to-digital converter coupled to the processor. The analog-to-digital converter may include a master track and hold amplifier configured to receive an analog input signal. The device may further include a plurality of paths coupled to an output of the master track and hold amplifier. Each path of the plurality of paths may include a slave track and hold amplifier coupled to the master track and hold amplifier, and a successive approximation register analog-to-digital converter coupled to an output of the slave track and hold amplifier.

According to another embodiment, the present disclosure includes methods for converting an analog signal to a digital signal. Various embodiments of such a method may include receiving an analog signal at a master track and hold amplifier. The method may also include sequentially sampling an output of the master track and hold amplifier with a plurality of slave track and hold amplifiers. Further, the method may include digitizing an output of each slave track and hold amplifier of the plurality of slave track and hold amplifiers via a plurality of successive approximation register analog-to-digital converters. In addition, the method may include combining an output of each successive approximation register analog-to-digital converter of the plurality of successive approximation register analog-to-digital converters to generate a digital signal.

The object and advantages of the embodiments will be realized and achieved at least by the elements, features, and combinations particularly pointed out in the claims. Both the foregoing general description and the following detailed description are exemplary and explanatory and are not restrictive.

BRIEF DESCRIPTION OF THE DRAWINGS

Example embodiments will be described and explained with additional specificity and detail through the use of the accompanying drawings in which.

DESCRIPTION OF SOME EXAMPLE EMBODIMENTS

The present disclosure relates to analog-to-digital converters (ADCs). In various embodiments, an ADC may include a high-bandwidth N-bit (N>=7) Nyquist-rate architecture configured for, for example, 35 GHz bandwidth, or more, and clock frequencies exceeding, for example, 70 GHz. The ADC may include a quasi-current mode logic (CML) master-slave sampling front-end driving a plurality of time-interleaved successive approximation registers (SARs) ADC lanes (e.g., N+1 or N+2, wherein N is equal to a number of bits of the ADC) in parallel.

Conventional SAR ADCs may include advanced complementary metal-oxide-semiconductor (CMOS) technology nodes, CMOS switches, CMOS logic, and binary-weighted capacitive digital-to-analog converters (DACs). However, the bandwidth and resolution of these devices are limited to less than 30 GHz and 8-bits or lower resolution.

To increase bandwidth and reduce thermal noise, embodiments of the present disclosure may include one or more metal-oxide-semiconductor-heterojunction bipolar transistor (MOS-HBT) quasi-CML track and hold amplifiers, MOS-HBT quasi-CML logic in each SAR ADC path, R-2R DACs and/or (e.g., 55-nm) SiGe BiCMOS technology that combines high-$f_{MAX}$ and low noise metal-oxide-semiconductor field-effect transistors (MOSFETs) (e.g., 55-nm MOSFETs) with ultra-low noise (e.g., 350 GHz $f_T/f_{MAX}$) SiGe HBTs. Accordingly, embodiments of the present disclosure may avoid performance limitations of FinFETs and fully depleted (FD) silicon-on-insulator (SOI) ADCs.

Although various embodiment may be implemented using only HBTs, the combination of MOSFETs and HBTs in circuit blocks of an ADC may decrease a required supply voltage and may reduce the total current consumption without compromising noise, input signal bandwidth or sampling clock frequency.

Some additional details of these and other embodiments are described with reference to the appended figures. In the appended figures, structures and features with the same item numbers are substantially the same unless indicated otherwise.

Figure 1:
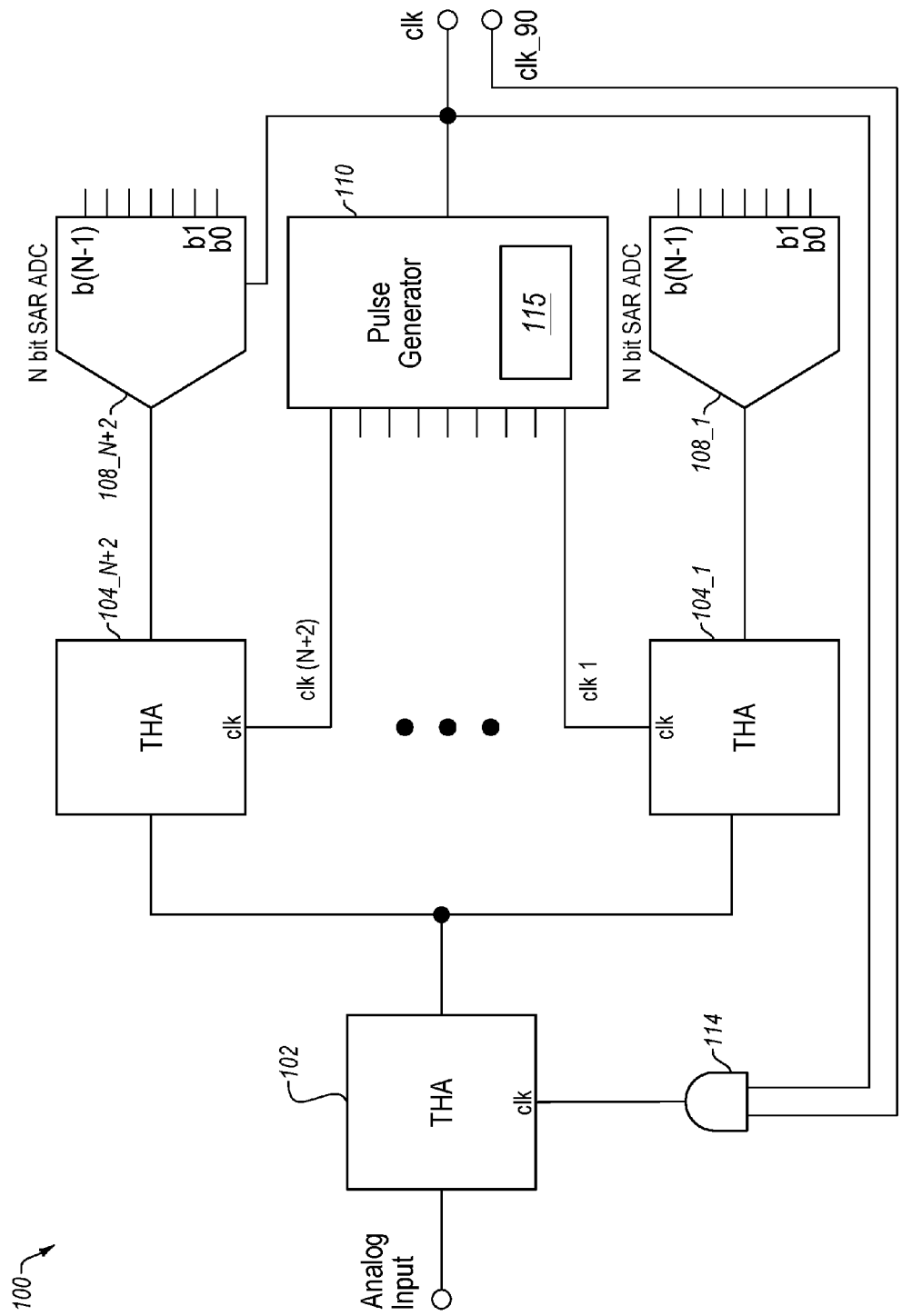
FIG. 1 depicts an example analog-to-digital converter.

FIG. 1 depicts an example analog-to-digital converter (ADC) 100. ADC 100 includes a first track and hold amplifier (THA) 102 and a plurality of second THAs 104. More specifically, for example, ADC 100 may include N+2 slave THAs, wherein N is the number of bits of ADC 100. First THA 102 may also be referred to herein as a "master THA" and each second THA 104 may be referred to herein as a "slave THA."

ADC 100 further includes a plurality of N-bit SAR ADCs 108, a pulse generator 110, and an AND gate 114. Thus, ADC 100 includes master THA 102, pulse generator 110, AND gate 114, and a plurality of paths (e.g., N+2 paths). Each path of the plurality of paths may include a slave THA 104 and an N-bit SAR ADC 108. Pulse generator 110 may include a sequencer (also referred to herein as a "phase generator") 115, which may be configured to convey one or more clock signals within ADC 100 (e.g., to each path of the plurality of paths).

According to various embodiments, ADC 100 may include MOS-HBT quasi-CML logic. For example, master THA 102 and slave THAs 104 may comprise MOS-HBT quasi-CML THAs. Further, SAR ADCs 108 may include MOS-HBT quasi-CML logic, and gate 114 may include a quasi-CML AND gate.

During a contemplated operation of ADC 100, master THA 102 may receive an analog input signal and a clock signal. In at least one embodiment, the input signal may be amplified by a low noise input buffer (not shown in FIG. 1; see FIG. 3) with, for example, 600 mV$_{pp}$ input linearity, good common-mode rejection (e.g., above 20 GHz), and less than, for example, 1 mV$_{rms}$ integrated input noise. Master THA 102 may sample and hold the amplified input signal using, for example, a 50-75 GHz clock with 25% duty cycle, which may be generated on chip by AND gate 114 and a pulse generator 110 (e.g., a 60-75 GHz quadrature signal generator based on a static frequency divider.

While in a hold mode, master THA 102 may output a constant value. This constant value may be sampled sequentially by slave THAs 104. More specifically, slave THA 104_1 may receive a first sample, slave 104_2 (not shown in FIG. 1) may receive a second sample, and so on, until slave 104_N+2 receives an (N+2)th sample. Each slave THA 104 may also receive a clock signal from pulse generator 110.

To reduce the loading at the output of master THA 102, each slave THA 104 may comprise a scaled-down version of master THA 102. In one example, wherein a number of bits N is equal to 8 (i.e., N=8), if master THA 102 is operating at 50 GHz, each slave THA 104 may operate at 5 GHz (i.e., 50 GHz/(N+2)). Each slave THA 104 may include an output buffer suitable for driving an interconnect and a latched comparator at the input of each ADC lane, as described more fully below.

Continuing with the contemplated operation of ADC 100, each slave THA 104 may output a signal to a corresponding SAR ACD 108, and each SAR ADC 108 may output an N-bit digital signal that describes the signal sample processed by the SAR ADC 108. Further, digital signals outputted from each SAR ADC 108 may be combined to reconstruct the original signal in a digital format. In at least one embodiment, to save power while maximizing sampling speed and input bandwidth, all paths within ADC 100 including associated N-bit R2R DACs (e.g., see R-2R DAC 508 of FIG. 5) may include minimum size SiGe HBTs biased at the peak fT current density.

In at least one embodiment, master THA 102 may not be required, and a relatively large linear buffer may have an output coupled to each path (i.e., an input of each slave THA 104). This embodiment may reduce power consumption of ADC 100 (e.g., via reducing the effort of a clock distribution network).

In some embodiments, to increase signal bandwidth, a total sampling rate may be increased. Even with time-interleaving of N+2 SAR paths, using slave track-and-hold amplifiers for updating held data at a frequency (e.g., clock frequency/(N+2)), an SAR loop may be required to work at the clock rate, with accumulated delay of several stages including a comparator, comparator latch, SAR logic and DAC. An SAR loop may inherently limit a maximum clock frequency even if power consumption is not a concern. In addition, a phase generation circuit (e.g., a sequencer) may be required to operate at a master clock frequency to generate the pulses that time each SAR path operation. Also, based on a loop of master-slave flip-flop circuits, increasing operation frequency may increase power consumption and may introduce other limitations.

According to various embodiments of the present disclosure, a plurality of ADCs (e.g., two ADCs) with the same clock frequency, and opposite phases may be time-interleaved to decrease, and possibly eliminate, one or more limitations related to clock frequency. For example, in an embodiment illustrated in FIG. 2, a system 118 includes an ADC 120A, an ADC 120B, and a master clock 121. ADC 120A and ADC 120B may each be configured to receive an analog input signal and a master clock signal (e.g., via master clock 121), Further, ADC 120A and ADC 120B may each be configured to generate a digital output signal (e.g., N(N+2) bit signal). For example, each of ADC 120A and ADC 120B may include ADC 100 of FIG. 1.

Figure 2:
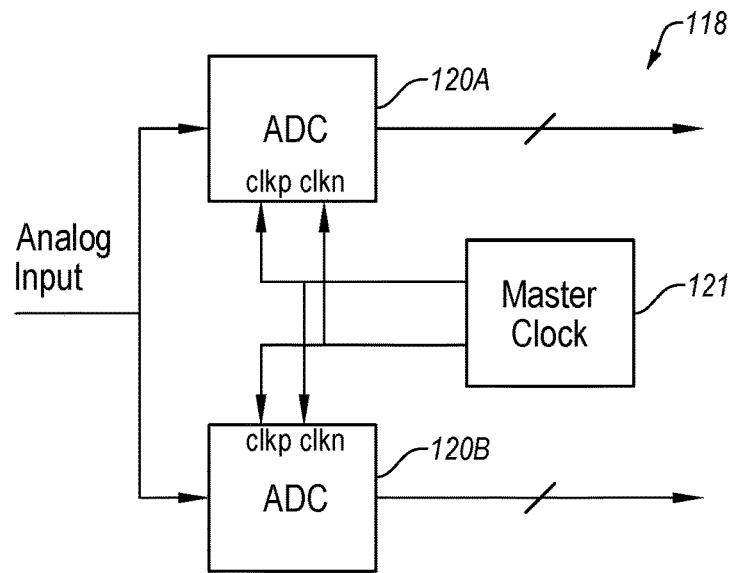
FIG. 2 depicts an example system including a plurality of analog-to-digital converters.
Figure 3:
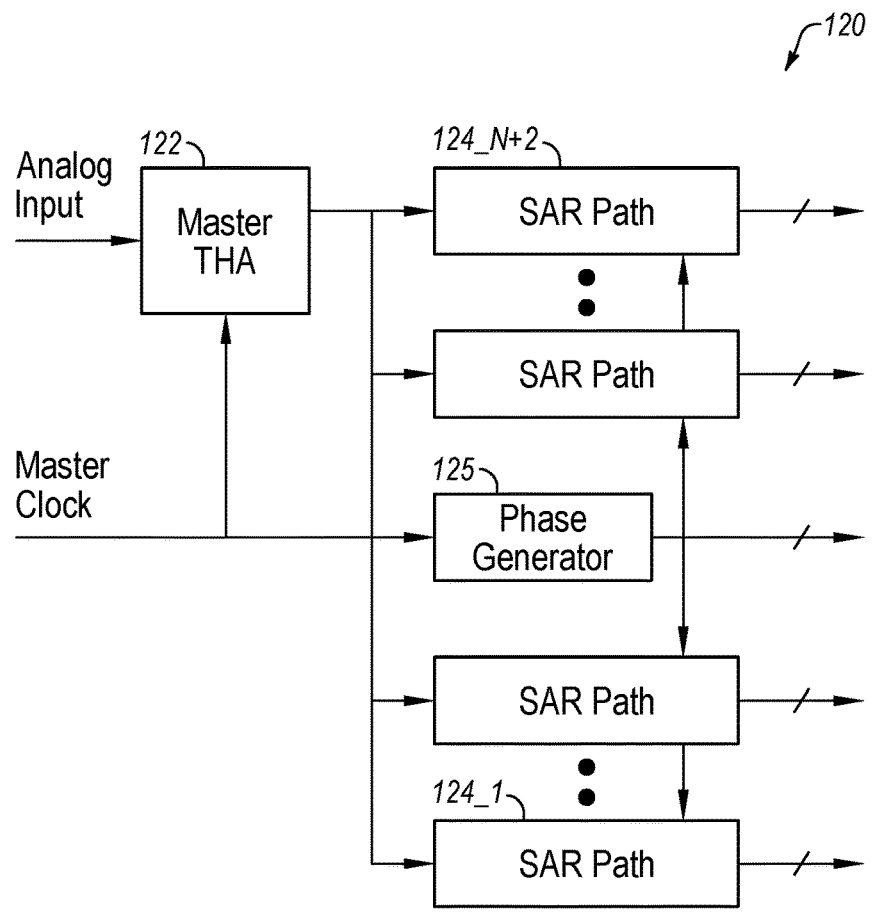
FIG. 3 depicts an example analog-to-digital converter.

FIG. 3 illustrates an ADC 120 including master THA 122, SAR paths 124, and a sequencer 125, arranged in accordance with at least one embodiment of the present disclosure. In one example, ADC 120 may include ADC 120A or ADC 120B (see FIG. 2). For example, ADC 120 may include N+2 SAR paths 124, wherein each SAR path 124 may be configured to generate an N-bit digital signal. Further, for example, sequencer 125 may be configured to receive a master clock signal (e.g., via master clock 121 of FIG. 2) and generate N+2 phases.

Figure 4:
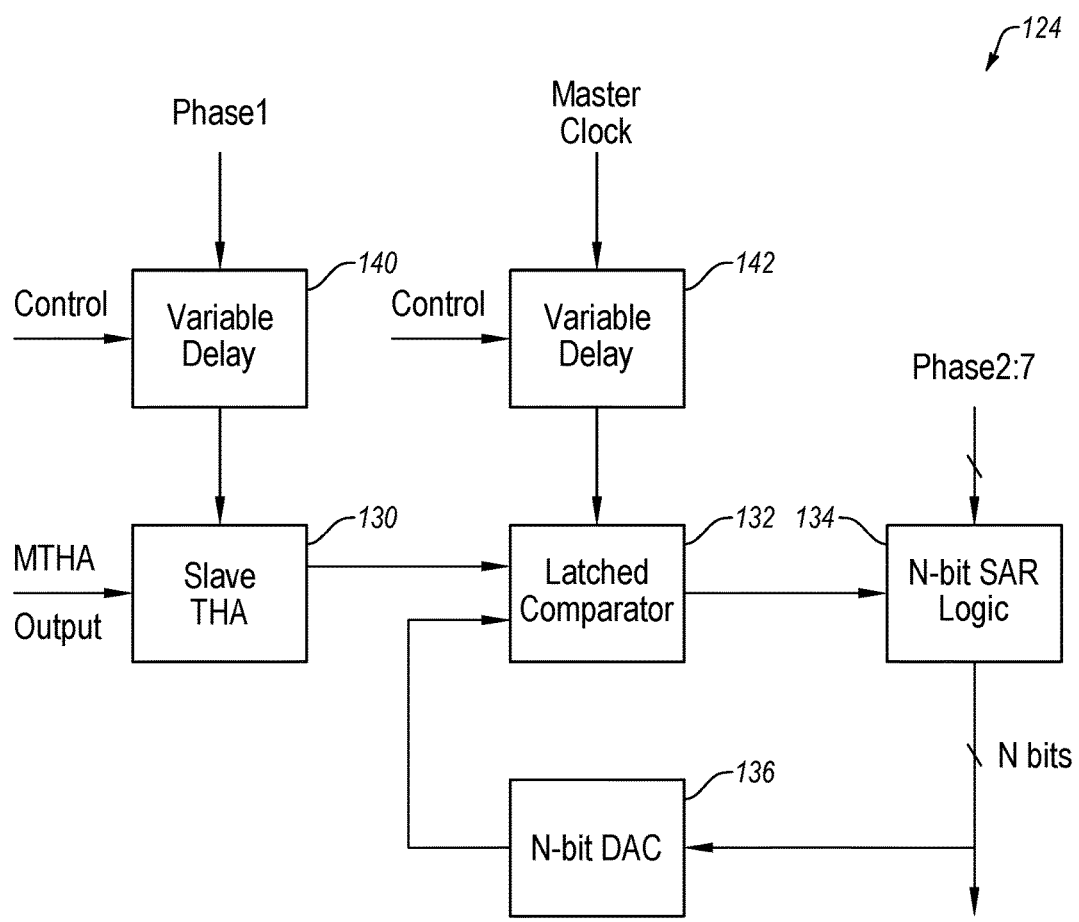
FIG. 4 is an illustration of an example successive approximation register (SAR) path.

Further, FIG. 4 depicts a SAR path 124, in accordance with one or more embodiments disclosed herein. SAR path 124 includes a slave THA 130, a comparator 132, N-bit SAR logic 134, an N-bit DAC 136, a variable delay component 140, and a variable delay component 142. Variable delay component 140 is configured to receive a control signal and a phase signal (e.g., for phase 1), and transmit a delayed phase signal to slave THA 130. Variable delay component 142 is configured to receive a control signal and a master clock signal, and transmit a delayed phase signal to comparator 132. Further, slave THA 130 may be configured to transmit an analog signal to comparator 132, which is configured convey a signal to N-bit SAR logic 134. N-bit SAR logic 134 may receive a plurality of phase signals (e.g., for phases 2-7). N-bit SAR logic 134 may also be configured to convey an output (e.g. a plurality of bits) to N-bit DAC 136, which may be configured to convey an analog signal to comparator 132. A more detailed description of a comparator, N-bit SAR logic, and an N-bit DAC will be provided below with reference to FIG. 8.

With reference again to FIG. 3, each of ADC 120A and ADC 120B may include a master track and hold amplifier (e.g., master THA 122) driven by a master clock (e.g., master clock 121), either in-phase or out-of-phase. In some embodiments, opposite phase clocks may drive independent phase generation circuits in each of ADC 120A and ADC 120B, thus generating phased pulses for SAR paths 124 (see e.g., FIG. 3) including half a clock cycle delay between ADC 120A and ADC 120B. Further, according to some embodiments, a comparator (e.g., comparator 132 of FIG. 4) in each of ADC 120A and ADC 120B may be clocked with the master clock at an opposite phase.

Accordingly, in various embodiments of the present disclosure, an ADC (e.g., ADC 120 of FIG. 3) may sample at a rate twice the master clock frequency. In some embodiments, if a lower than twice the rate is sufficient, the master clock frequency may be reduced. Since various components (e.g., of an ADC) may not need to operate at the highest possible frequency, components may be sized accordingly, thus power consumption may be reduced while maintaining accuracy.

Figure 5:
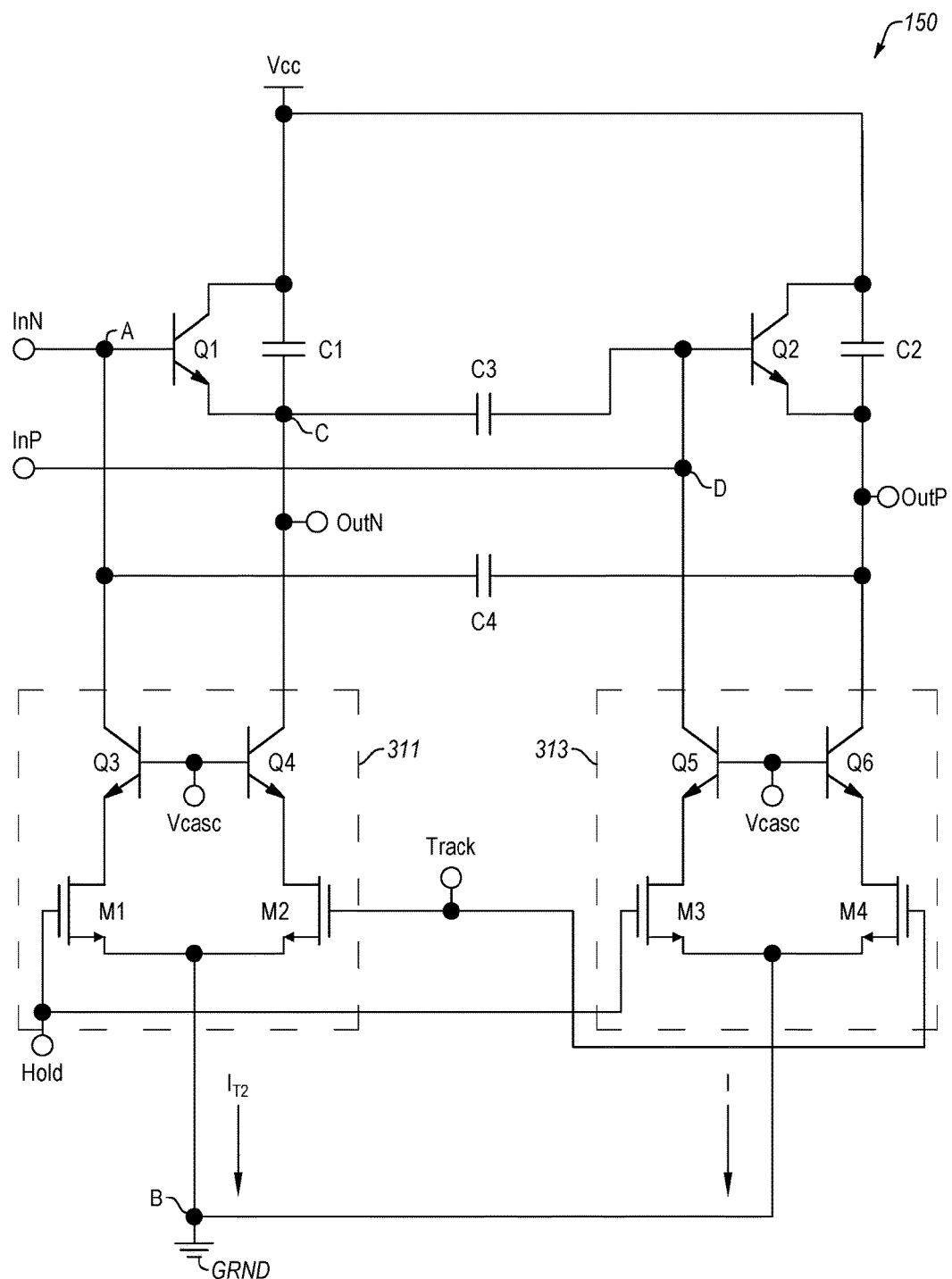
FIG. 5 is a circuit diagram of an example track and hold amplifier core.

FIG. 5 is a circuit diagram of an example THA core 150. For example only, master THA 102 and/or slave THA 104 of FIG. 1 may comprise THA core 150. In one embodiment, master THA 102 may also include one or more buffers (e.g., buffer 200 illustrated in FIG. 6) coupled to THA core 150. THA core 150 includes a differential input including a first input InN and a second input InP and a differential output including a first output OutN and a second output OutP. THA core 150 also includes transistors Q1-Q6, transistors M1-M4, capacitors C1-C4, a voltage supply Vcc, and a ground GRND. It is noted that although FIG. 2 depicts capacitors C1-C4, THA core 150 may include any suitable energy storage elements. According to at least one embodiment, transistors Q1-Q6 may comprise bipolar transistors, and transistors M1-M4 may comprise MOSFETs (e.g., N-channel field-effect transistors (FETs)).

According to various embodiments, THA core 150 includes a MOS-HBT cascode differential switch including a cascode switch 311 and a cascode switch 313. As illustrated, cascode switch 311 includes transistors Q3, Q4, M1, and M2, and cascode switch 313 includes transistors Q5, Q6, M3, and M4.

By way of example, voltage supply Vcc may comprise a 2.5 V voltage supply with a maximum differential input voltage of, for example only, 600 mVpp. In at least one embodiment, a bandwidth may exceed 50 GHz, a maximum sampling rate may comprise 75 GS/s, and the power consumption of THA core 150 may be substantially 42.5 mW.

In one specific embodiment, as illustrated in FIG. 5, a collector of transistor Q3 is coupled to a node A, which is further coupled to input InN and a base of transistor Q1. A base of transistor Q3 is coupled to a base of transistor Q4, and a base of transistor Q5 is coupled to a base of transistor Q6. Each of transistors Q3-Q6 is configured to receive a bias voltage Vcasc at its base.

An emitter of transistor Q3 is coupled to a drain of transistor M1. A source of transistor M1 is coupled to a node B, which is further coupled to sources of transistors M2-M4 and a ground GRND. A gate of transistor M1 and a gate of transistor M3 are each configure to receive a hold signal, and the gates of transistors M2 and M4 are configured to receive a track signal. An emitter of transistor Q4 is coupled to a drain of transistor M2, and a collector of transistor Q4 is coupled to an output OutN, which is further coupled to a node Node C is further coupled to an emitter of transistor Q1. An emitter of transistor Q5 is coupled to a drain of transistor M3, and a collector of transistor Q5 is coupled to a node D. Node D is further coupled to input InP, which is also coupled to a base of transistor Q2. An emitter of transistor Q6 is coupled to a drain of transistor M4, and a collector of transistor Q9 is coupled to an output OutP. Output OutP is further coupled to an emitter of Q2. Collectors of transistors Q1 and Q2 are coupled to voltage supply Vcc.

Further, capacitor C1 is coupled between the emitter of transistor Q1 and the collector of transistor Q1, and capacitor C2 is coupled between the emitter of transistor Q2 and the collector of transistor Q2. Capacitors C1 and C2 may also be referred to herein as "charging nodes," "hold capacitors" or "charging capacitors." As non-limiting examples, each of capacitor C1 and C2 may comprise 60 fF. Capacitor C3 is coupled between node C and base of transistor Q2, and capacitor C4 is coupled between node A and output OutP. Capacitors C3 and C4 may also be referred to herein as "feedforward capacitors." As non-limiting examples, each of capacitor C3 and C4 may comprise 10 fF. In another embodiment, capacitors C3 and C4 may be removed to improve the bandwidth.

For example only, during a contemplated operation of THA core 150, a voltage at inputs InN and InP may comprise substantially 2 V, a current through each of transistors Q3-Q6 may comprise substantially 2.45 mA, a voltage at the bases of each of transistors Q3-Q6 may comprise substantially 1.54 V, and a voltage at outputs OutN and OutP may comprise substantially 1.16 V.

During a track mode, a track signal, which is conveyed to transistors M2 and M4, is high while a hold signal, which is conveyed to transistors M1 and M3, is low. As a result, transistors Q1 and Q2 may be turned on (i.e., operating in a conductive state), acting as emitter followers and charging capacitors C1 and C2. Stated another way, the differential MOS-HBT switch may swing its entire current (e.g., 4 mA) into the emitter follower transistors Q1 and Q2, charging capacitors C1 and C2, and generating an output signal that may track the input signal. It is noted that the accuracy at which THA 150 follows the input signal may depend on a linear input buffer (e.g., input buffer 200 shown in FIG. 6) and the linearity of the switch.

In a hold mode, a hold signal, which is conveyed to transistors M1 and M3, is high and current may be directed away from the base of emitter follower transistors Q1 and Q2 through transistors M1 and M3. Emitter follower transistors Q1 and Q2 may be turned off (i.e., operating in a non-conductive state) and capacitors C1 and C2 are isolated from the input signal. When the hold signal is high, a current IT2 may flow through transistor M1 generating an additional voltage drop on load resistor RL of an input buffer (e.g., input buffer 200 shown in FIG. 6). This voltage drop may lower a base voltage of transistors Q1 and Q2 to a level wherein transistors Q1 and Q2 may be completely turned off.

It is noted that, in at least one embodiment, capacitors C3 and C4 may include overlapping metal stripes in the top two metal layers. This configuration may reduce parasitic coupling to a substrate, minimize layout footprint, and increase circuit bandwidth. However, the maximum bandwidth may be obtained if capacitors C3 and C4 are removed from the circuit.

It is further noted that an input buffer (e.g., input buffer 200 of FIG. 6) may play an important role in the operation of a THA (e.g., THA 102 or THA 104), as it may determine the linearity of THA. The input buffer may closely track the input signal while providing a linear gain, as any distortion due to the non-linearity of the input buffer may directly affect the analog value stored on the hold capacitor during the hold mode. A design of the input buffer, and especially the choice of the voltage drop on its load resistor, may impact the performance of the switch (i.e., including switches 311 and 313) in the hold phase.

As non-limiting examples, THA core 150 may exhibit a switching speed of Substantially 75 GS/s or faster, an input linear range of substantially 300 mVpp per side, and an input bandwidth of more than substantially 30 GHz. Further, THA core 150 may exhibit a 7 bit accuracy, and consume less than substantially 20 mW of power.

Figure 6:
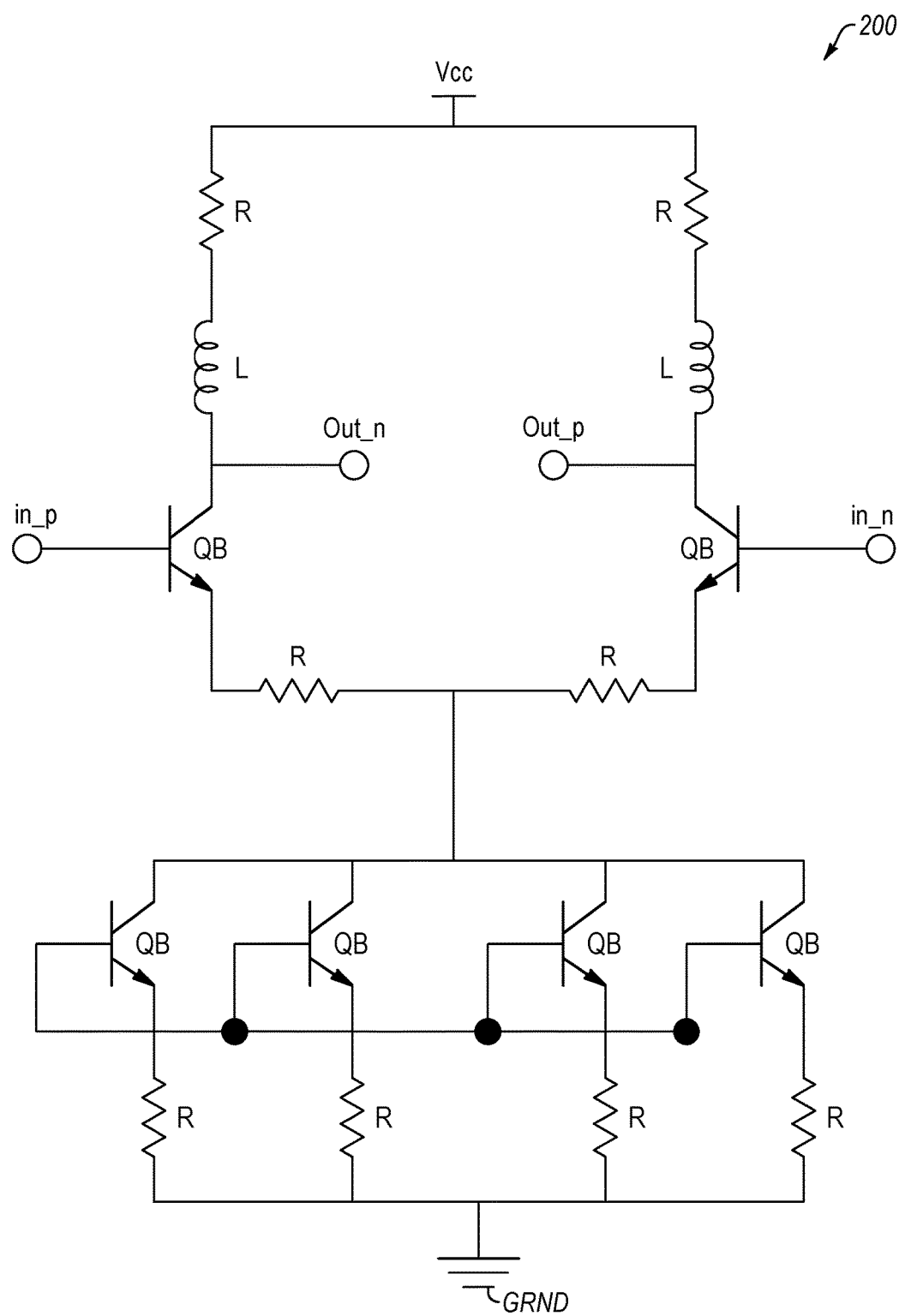
FIG. 6 depicts an example buffer that may be coupled to a track and hold amplifier core.

FIG. 6 is an example linear buffer 200. For example only, master THA 102 of FIG. 1 may comprise buffer 200 coupled to an input of THA core 150 (see FIG. 5). Buffer 200 includes differential inputs in_p and in_n, and differential outputs out_p and out_n. In at least one embodiment, differential outputs out_p and out_n of buffer 200 may be coupled to differential inputs InP and InN of THA core 150 (see FIG. 5). Buffer 200 further includes transistors QB, inductors L, resistors R, voltage supply Vcc, and ground GRND. Buffers are well known in the art, and therefore, buffer 200 will not be described in further detail.

Figure 7:
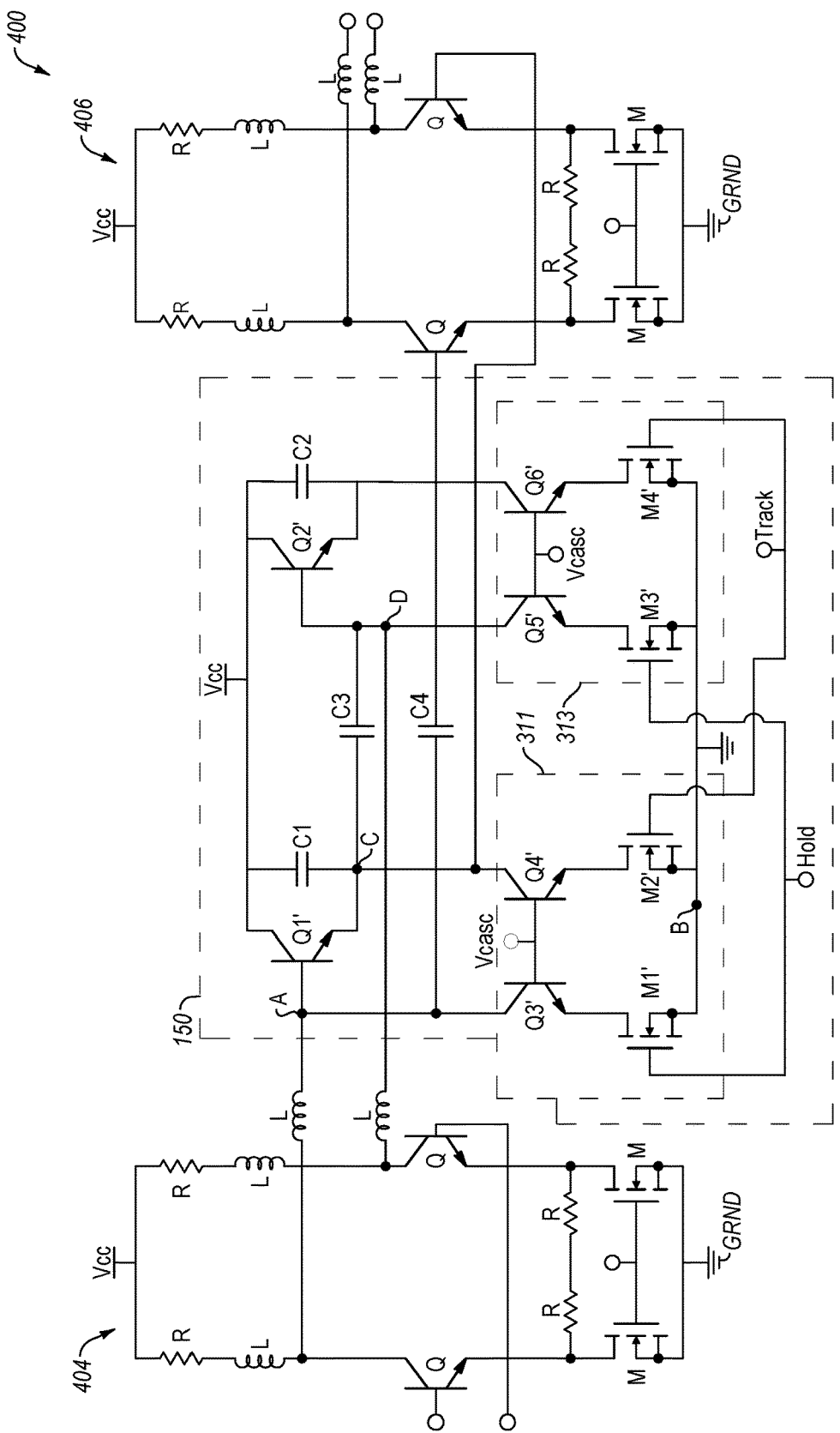
FIG. 7 depicts an track and hold amplifier core coupled between an input buffer and an output buffer.

FIG. 7 depicts an example THA 400 including THA core 150, as described above. THA 400 further includes input buffer 404 and output buffer 406. In at least one embodiment, each slave THA 104 (see FIG. 1) may include THA 400. It is noted that although master THA 102 (see FIG. 1) and slave THA 104 may each include THA core 105, one or more components of THA core 150 in master THA 102 may be different than one or more components sizes of THA core 150 in slave THA 104. For example, the sizes of one or more transistors (e.g., transistors Q1-Q6 and M1-M4) in THA core 150 in master THA 102 may be different than the sizes of one or more transistors (e.g., transistors Q1'-Q6' and M1'-M4') in THA core 150 in slave THA 104.

It is noted that input buffer 404 is an example input buffer, and slave THA 400 may include any suitable input buffer. Similarly, output buffer 406 is an example output buffer, and slave THA 400 may include any suitable output buffer.

Figure 8:
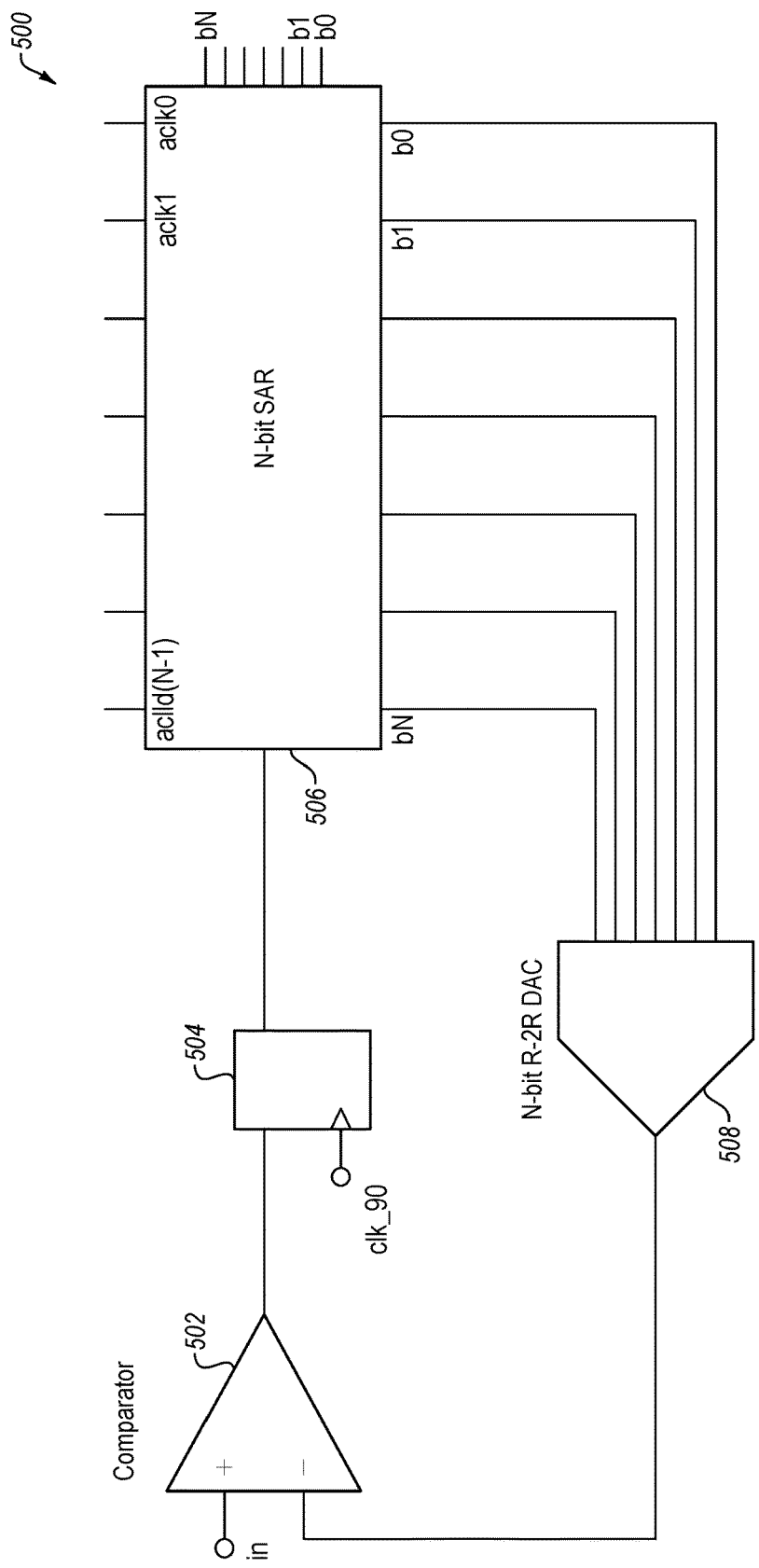
FIG. 8 is a block diagram of an example successive approximation register analog-to-digital converter.

FIG. 8 is a block diagram of an example SAR ADC 500 including a comparator 502, a latch 504, an N-bit SAR 506, and an N-bit R-2R DAC 508. For example, latch 504 may comprise a D-latch.

Comparator 502 may include one input coupled to an output of slave THA 104 (see FIG. 1) and another coupled to an output of N-bit R-2R DAC 508. Although not illustrated in FIG. 8, comparator 502 may comprise a differential comparator. An output of comparator 502 may be coupled to an input of latch 504, which is further coupled to N-bit SAR 506. N-bit SAR 506 may be configured to receive a signal from latch 504 and digital clock signals aclk0-aclk(N−1) (e.g., from pulse generator 110 of FIG. 1). Further, N-bit SAR 506 may be configured to digitize the signal received from latch 504 to generate output signals b0-b(N−1). Output signals b0-b(N−1) generated via a SAR 506 in each path of ADC 100 (see FIG. 1) may be combined to reconstruct the original signal (i.e., the analog signal received at master THA 102) in a digital format. Further, output signals b0-b(N−1) may be conveyed to N-bit R-2R DAC 508, which may generate an analog signal (i.e., based on signals b0-b(N−1)) that may be conveyed to comparator 502 as a reference input.

In at least one embodiment, R-2R DAC 508, which may comprise a differential R-2R DAC, may provide quasi-CML compatible output levels for the reference inputs of comparator 502. By avoiding a capacitive DAC architecture and by utilizing HBT switches (e.g., minimum sized HBT switches) with, for example, 1 mA current sources, a signal bandwidth at the input of SAR ADC 500 may be enhanced.

Figure 9:
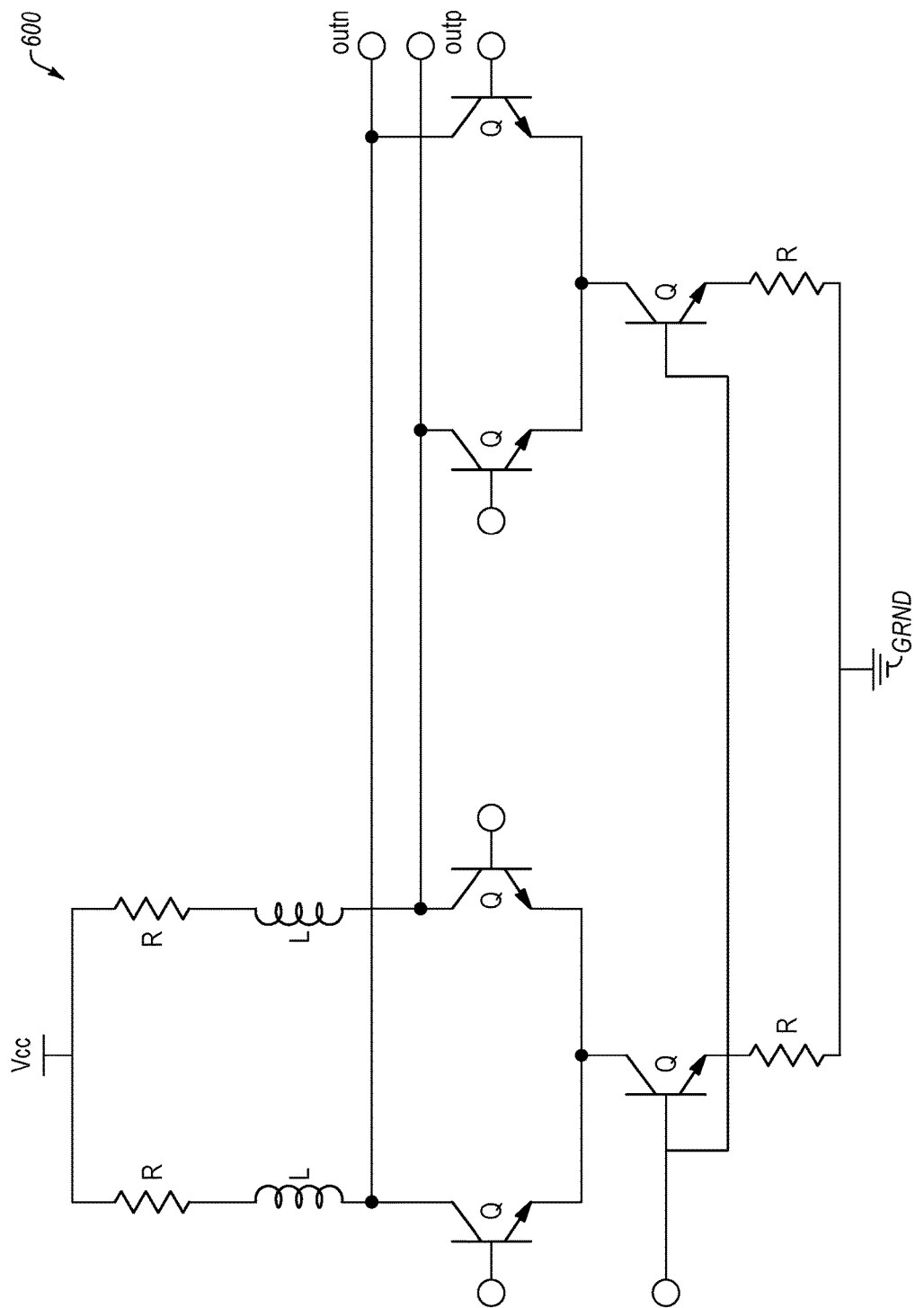
FIG. 9 is a circuit diagram of an example comparator.

FIG. 9 is a circuit diagram of an example differential comparator 600. According to at least one embodiment, comparator 502 (see FIG. 8) may be implemented via comparator 600 of FIG. 9. It is noted that differential comparator 600 is an example comparator, and comparator 502 of FIG. 8 may include any suitable comparator.

Figure 10:
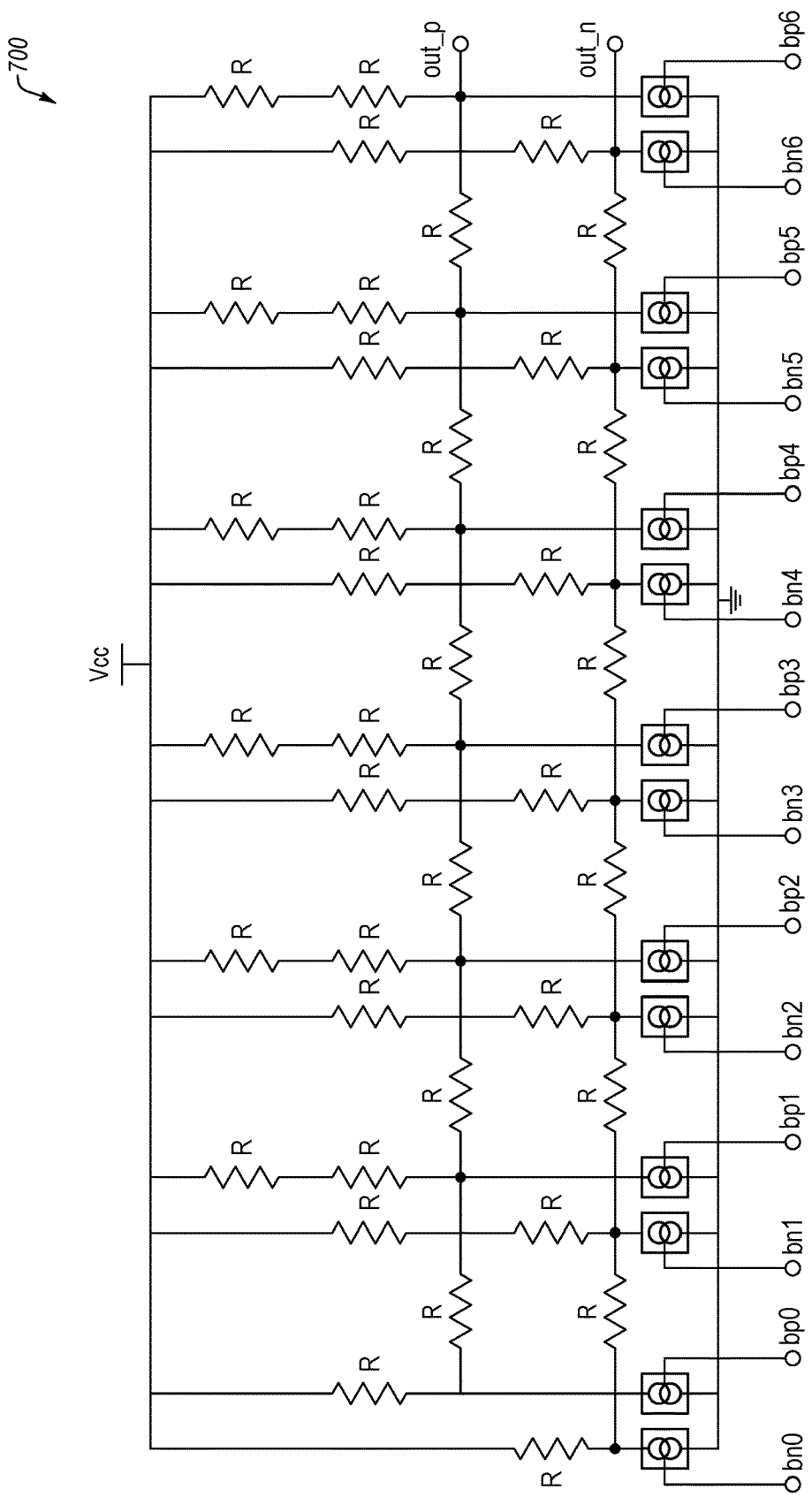
FIG. 10 is a circuit diagram of an example R-2R digital-to-analog converter.

FIG. 10 is a circuit diagram of an example R-2R DAC 700. According to at least one embodiment, N-bit R-2R DAC 508 (see FIG. 8) may be implemented via R-2R DAC 700 of FIG. 7. It is noted that R-2R DAC 700 is an example R-2R DAC, and N-bit R-2R DAC 508 of FIG. 8 may include any suitable comparator.

Figure 11A:
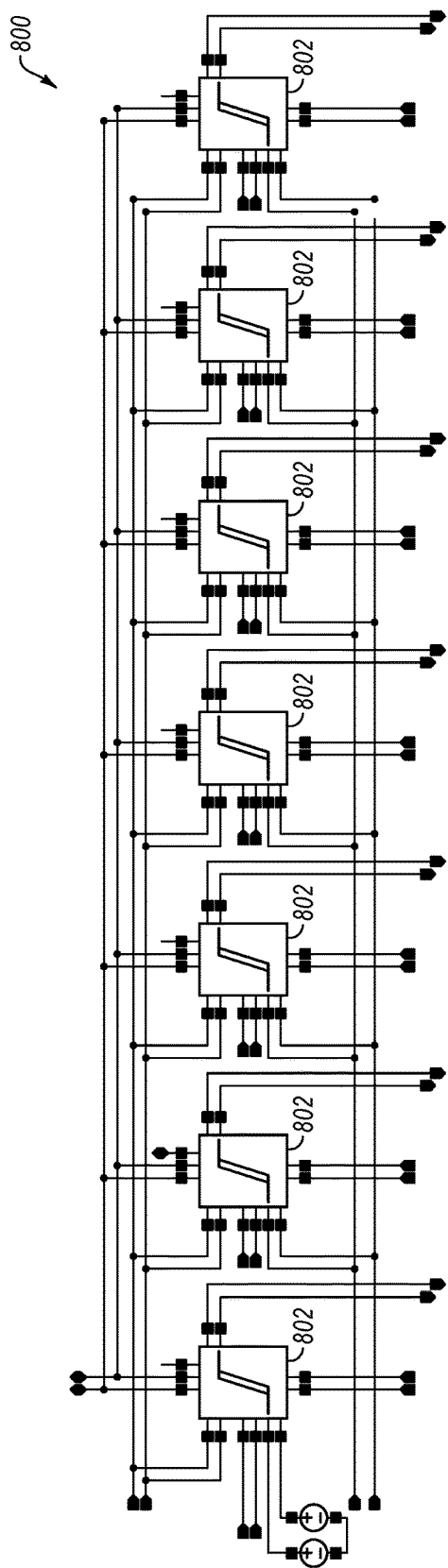
FIG. 11A is schematic of an example successive approximation register.

FIG. 11A is a schematic of an example N-bit SAR 800 including a plurality of cells 802 (i.e., N cells). Specifically, FIG. 11A depicts seven (7) cells 802. According to at least one embodiment, N-bit SAR 506 (see FIG. 8) may be implemented via N-bit SAR 800 of FIG. 11A. N-bit SAR 800 may be asynchronously clocked through clock signals from pulse generator 110 (see FIG. 1). It is noted that N-bit SAR 800 is an example N-bit SAR, and N-bit SAR 506 of FIG. 8 may include any suitable N-bit SAR.

Figure 11B:
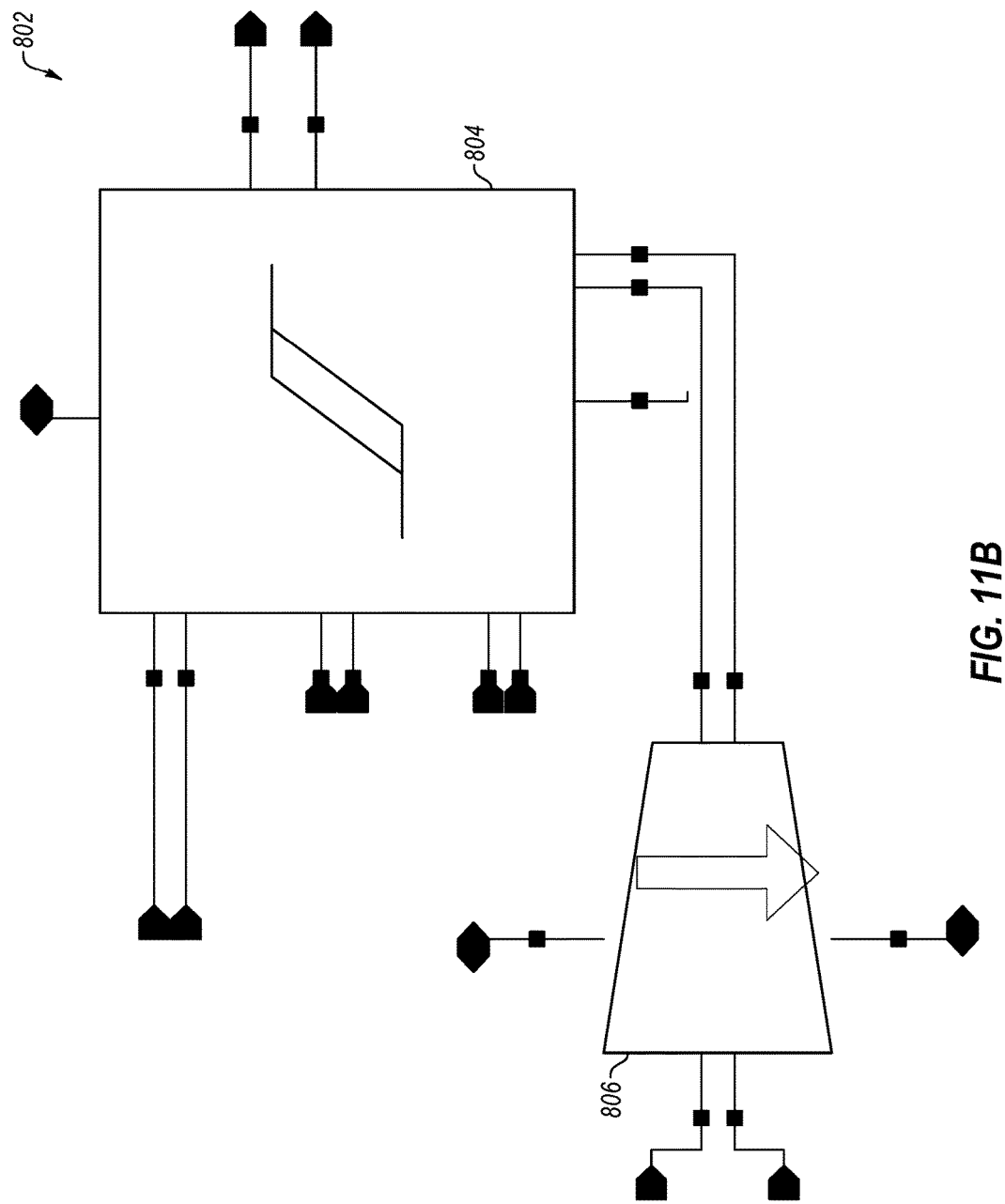
FIG. 11B is a schematic of a cell of an example successive approximation register.
Figure 11C:
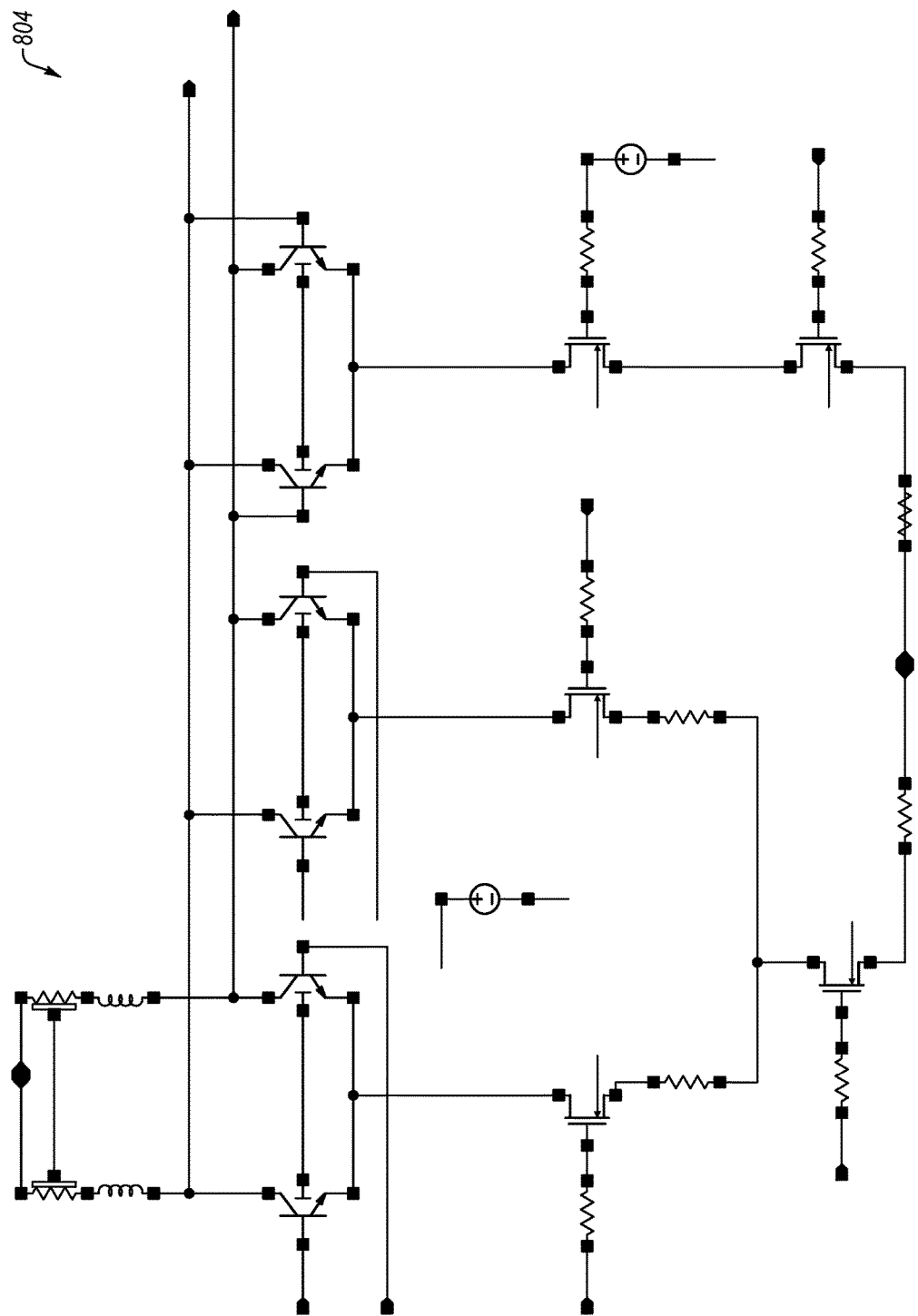
FIG. 11C is a transistor-level schematic of a settable, resettable latch in a cell of an example successive approximation register.
Figure 11D:
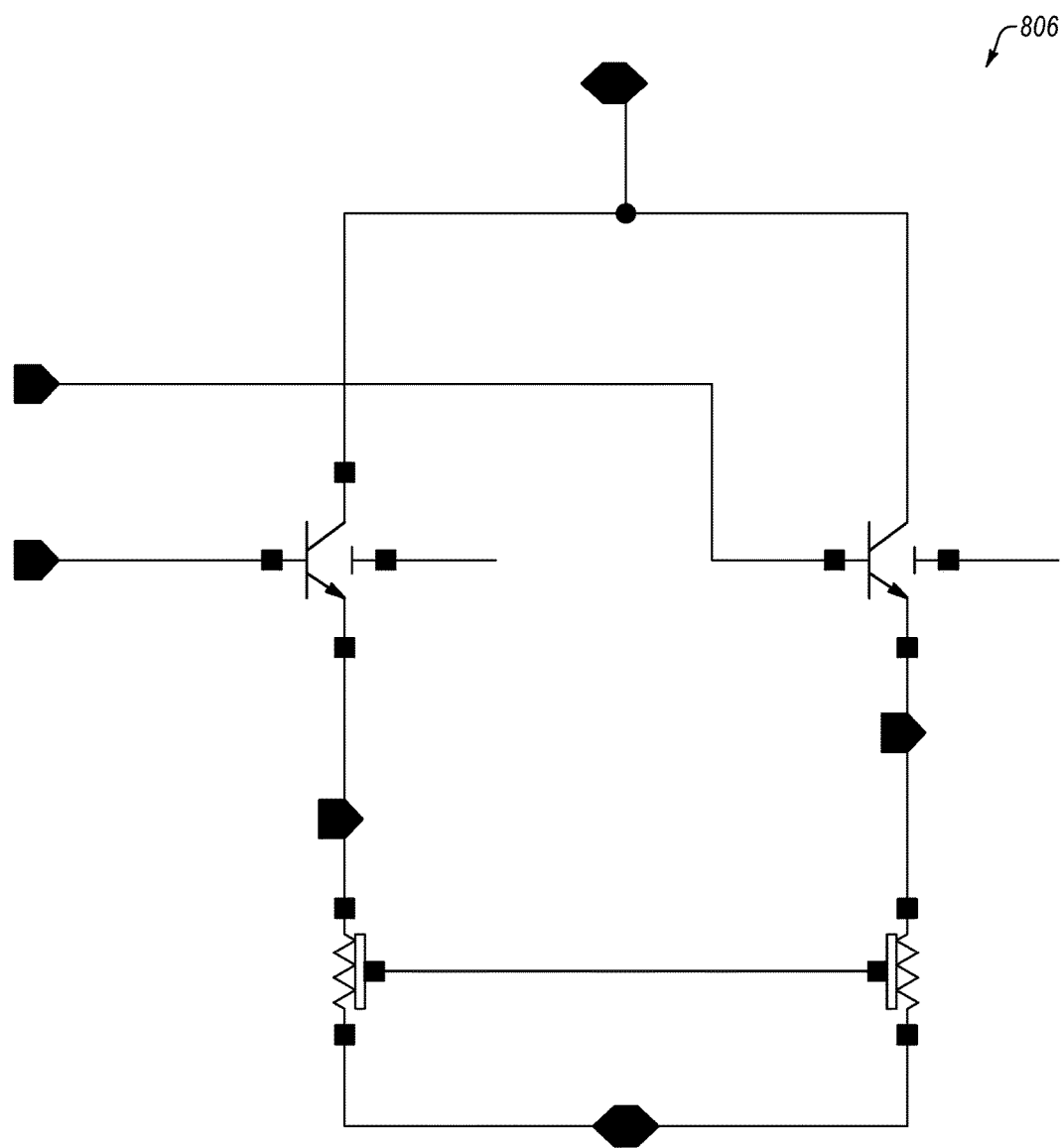
FIG. 11D is a transistor-level schematic of an emitter follower in a cell of an example successive approximation register.

FIG. 11B is a schematic of a cell 802 of SAR 800. Cell 802 includes a settable, resettable latch 804 and an emitter follower 806. FIG. 11C is a transistor-level schematic of settable, resettable latch 804 in cell 802 (see FIG. 11B). In at least one embodiment, settable, resettable latch 804 includes four-level BiCMOS quasi-CML, wherein two levels of the four-level BiCMOS quasi CML each comprise one or more MOSFETs, and two levels of the four-level BiCMOS quasi CML each comprise one or more HBTs. Further, FIG. 11D is a transistor-level schematic of an emitter follower 806 in cell 802 (see FIG. 11B).

Figure 12A:
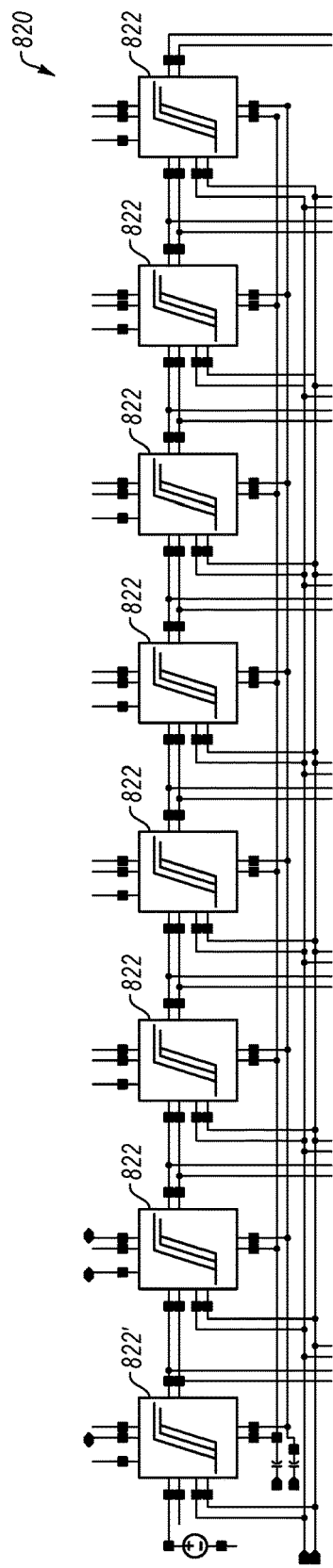
FIG. 12A is a schematic of an example sequencer.

FIG. 12A is a schematic of an example sequencer 820 including a plurality of blocks 822 (e.g., N+2 blocks). With reference to FIG. 1, pulse generator 110 includes sequencer 115, which may comprise sequencer 820. Specifically, FIG. 12A depicts eight (8) blocks 822, wherein a leftmost block (indicated by reference number 822') includes a settable flip-flop 824 (see FIG. 12B) and the remaining blocks (indicated by reference number 822) include resettable latch 826 (see FIG. 12C). According to at least one embodiment, sequencer 820 may operate at substantially 1.8 V. It is noted that sequencer 820 is an example sequencer, and sequencer 115 of FIG. 1 may include any suitable sequencer.

Figure 12B:
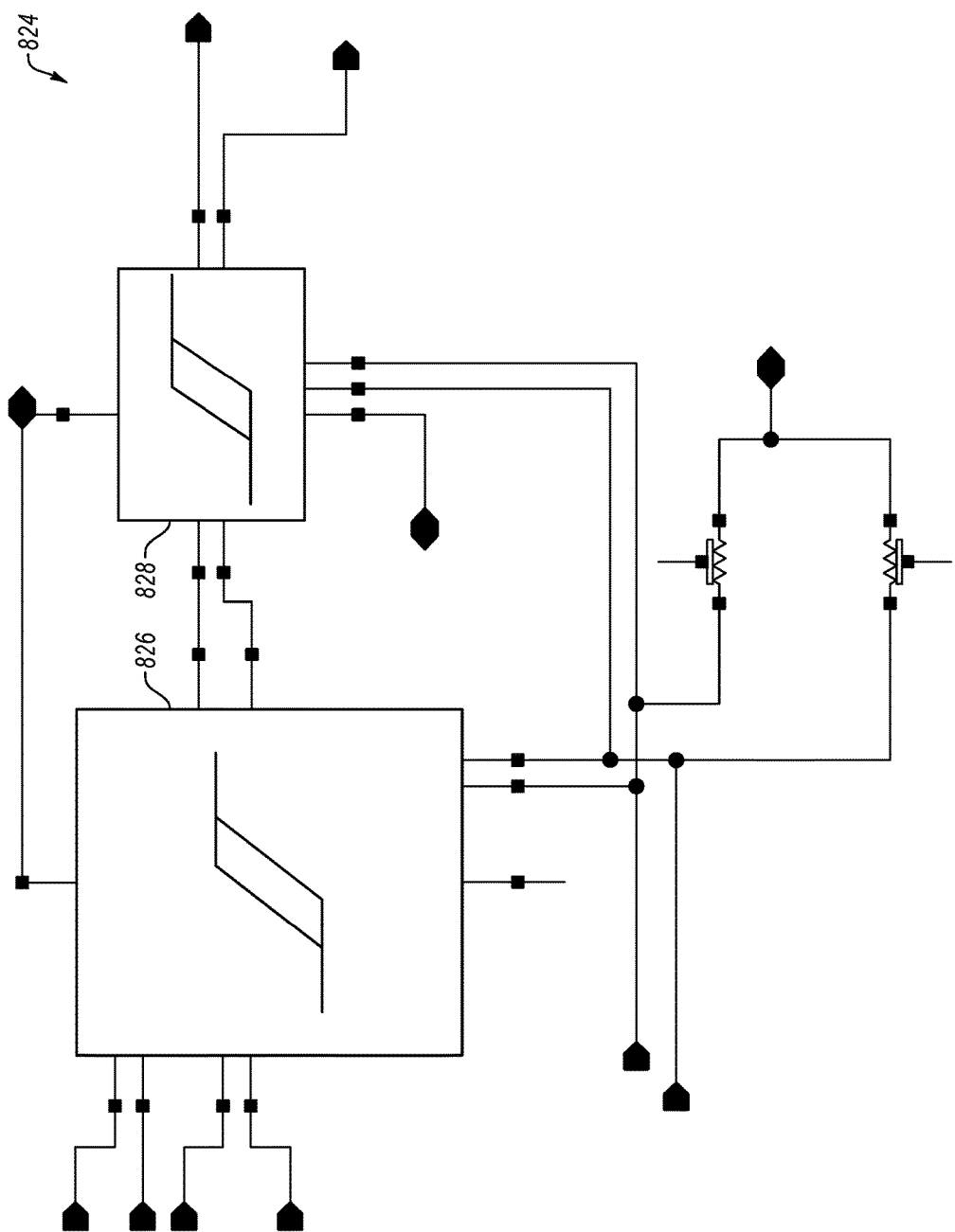
FIG. 12B is a schematic of an example settable flip-flop in an example sequencer.
Figure 12C:
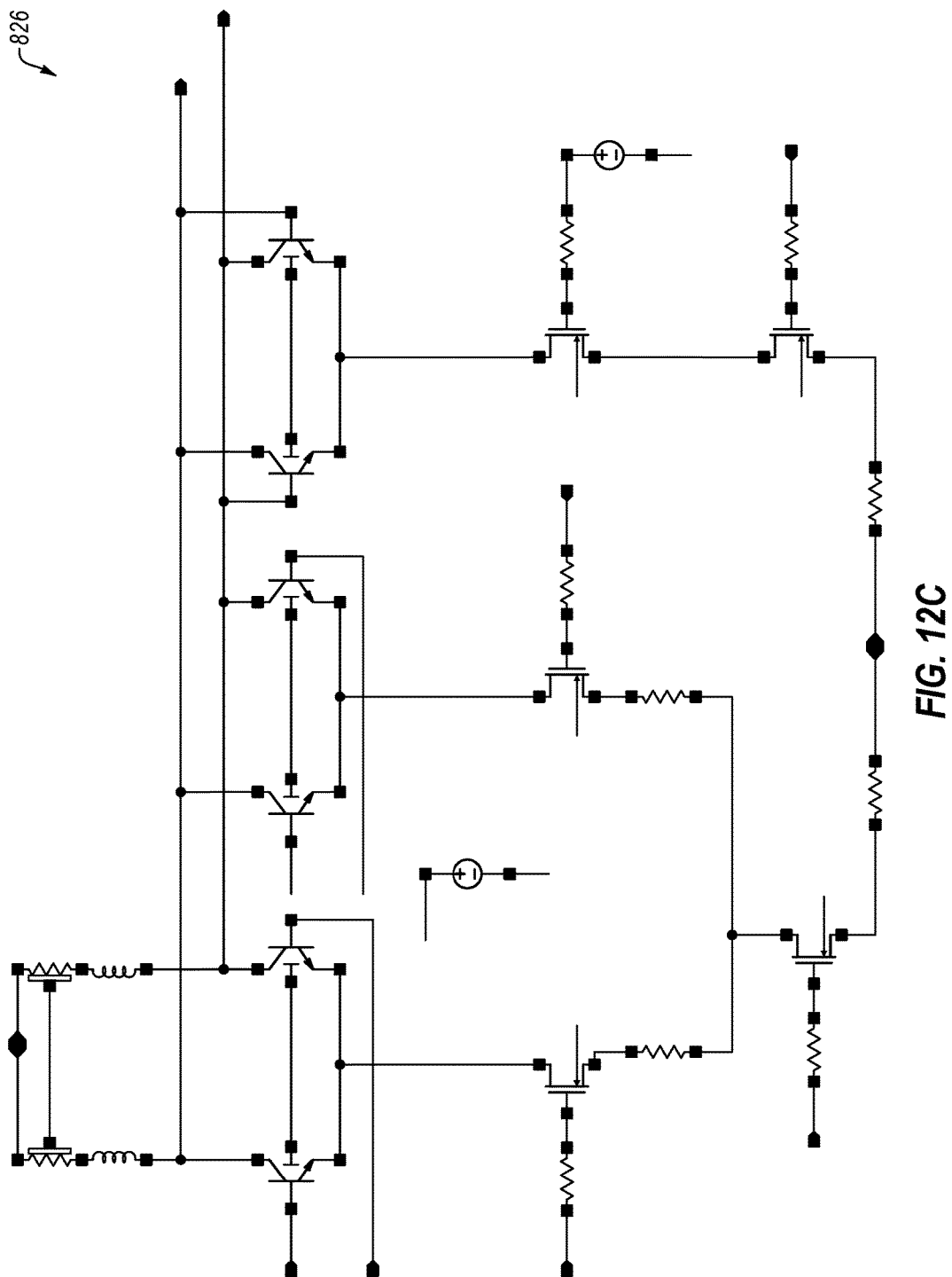
FIG. 12C is a schematic of an example settable latch in an example sequencer.
Figure 12D:
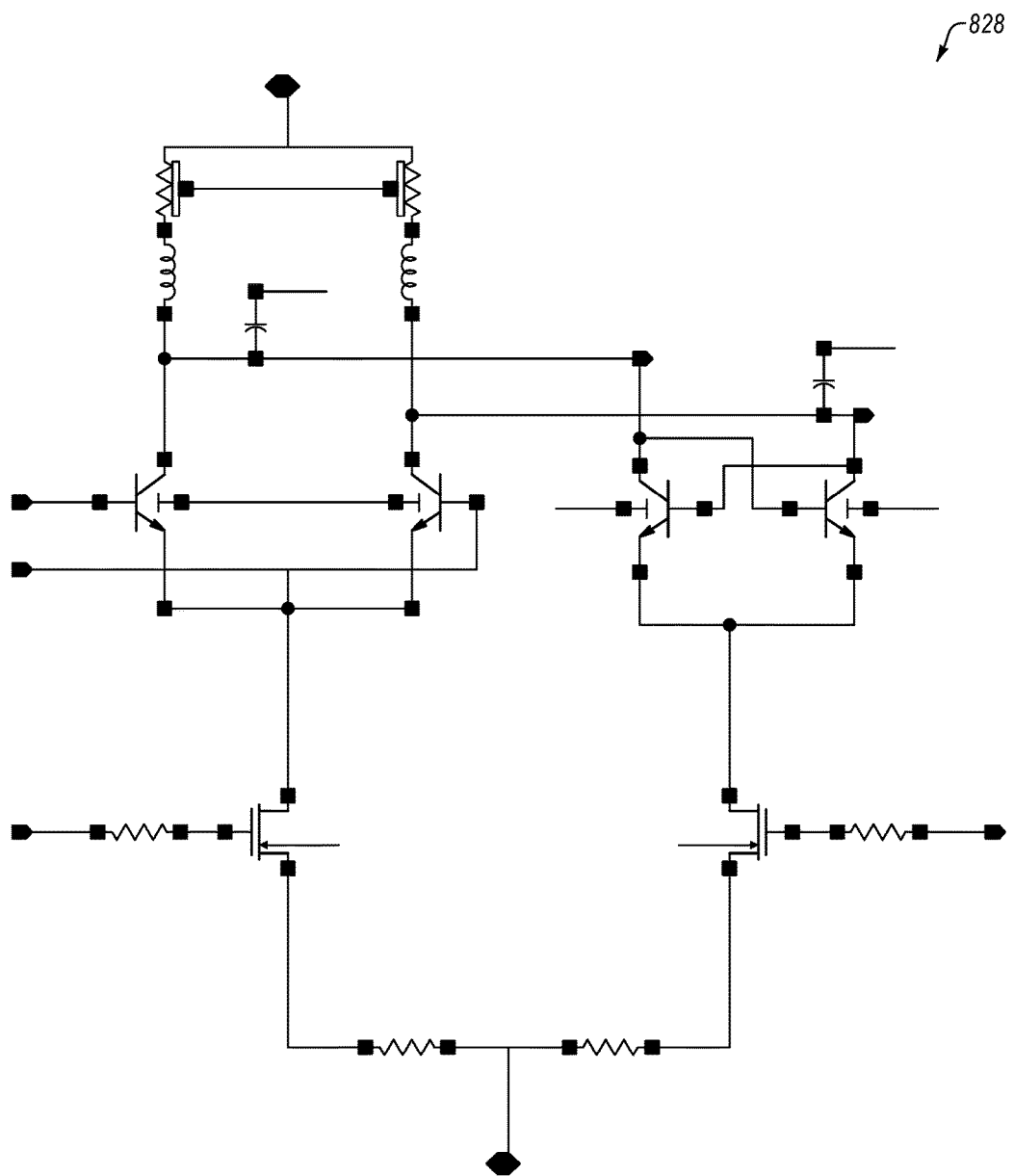
FIG. 12D is a schematic of an example latch in an example sequencer.

FIG. 12B is a schematic of a settable flip-flop 824 in an example sequencer. Settable flip-flop 824 includes a settable latch 826 and a latch 828. FIG. 12C is a schematic of settable latch 826, and FIG. 12D is a schematic of latch 828. In at least one embodiment, settable latch 826 includes three-level BiCMOS quasi-CML, wherein one level of the three-level BiCMOS quasi CML comprises one or more MOSFETs, and two levels of the three-level BiCMOS quasi CML each comprise one or more HBTs.

Figure 12E:
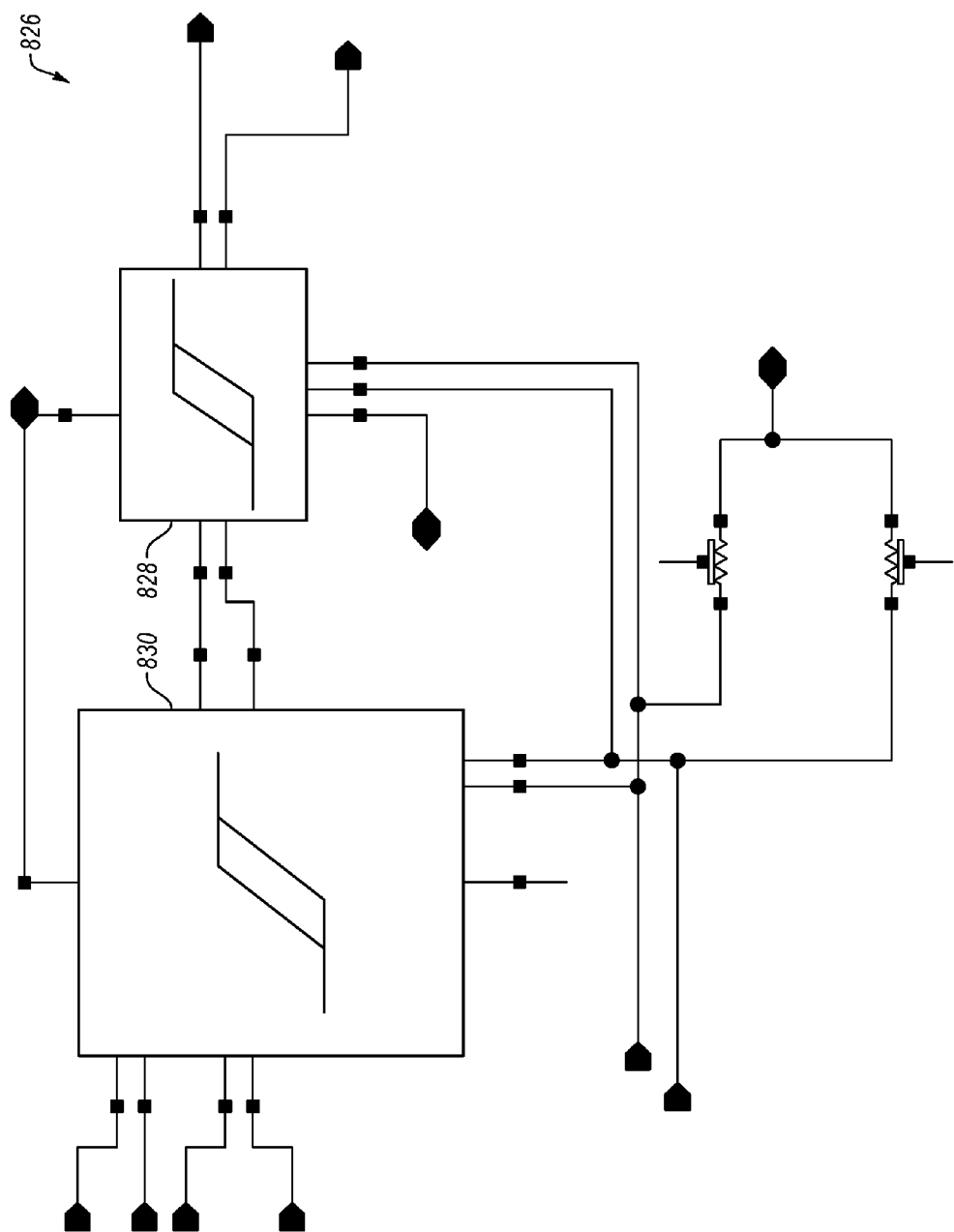
FIG. 12E is a schematic of an example resettable flip-flop in an example sequencer.
Figure 12F:
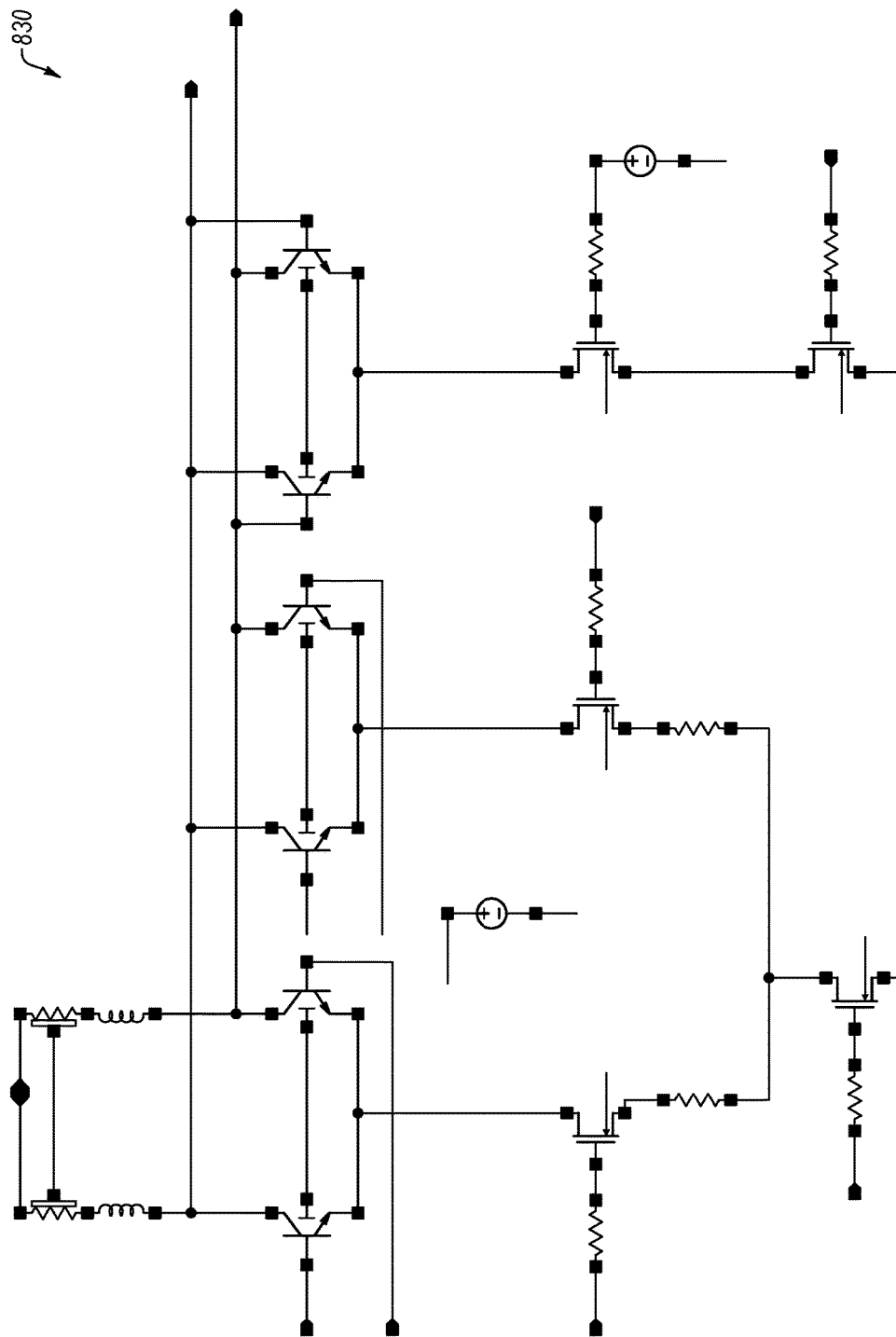
FIG. 12F is a schematic of an example resettable latch in an example sequencer.

Further, FIG. 12E is a schematic of a resettable flip-flop 826 including a resettable latch 830 and latch 828. FIG. 12F is a schematic of a resettable latch 830. In at least one embodiment, resettable latch 830 includes three-level BiCMOS quasi-CML, wherein one level of the three-level BiCMOS quasi CML comprises one or more MOSFETs, and two levels of the three-level BiCMOS quasi CML each comprise one or more HBTs.

Figure 13:
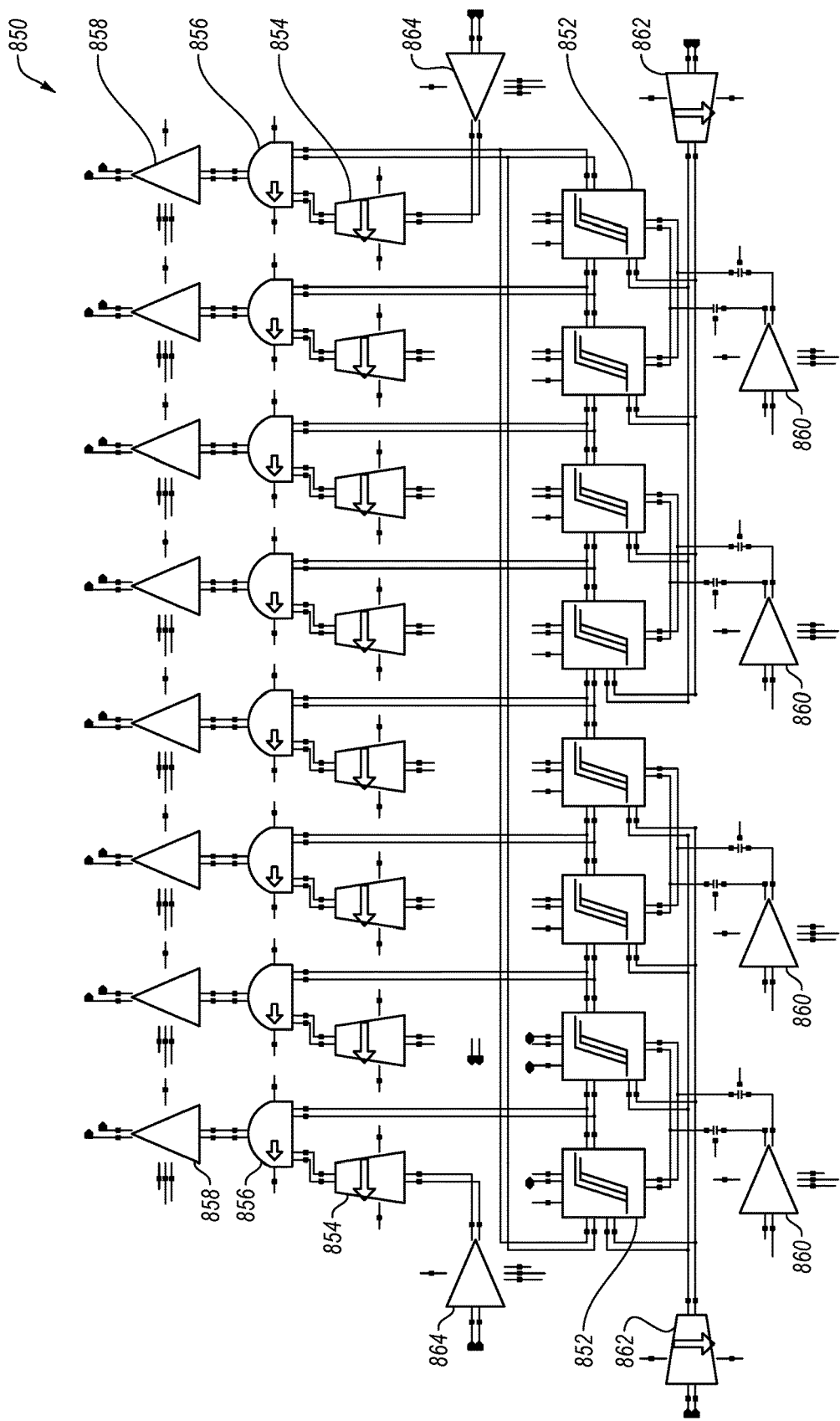
FIG. 13 is a schematic of another example sequencer.

In some embodiments, to clock time-interleaved SAR paths (e.g., N+2 time-interleaved SAR paths), a sequencer may be utilized. For example, FIG. 13 depicts an example sequencer 850, arranged in accordance with at least one embodiment of the present disclosure. Sequencer 850 includes a plurality of paths (e.g., eight paths as illustrated in FIG. 13), wherein each path includes a flip-flop 852, an emitter-follower 854, an AND gate 856, and a buffer 858. Sequencer 850 further includes buffers 860, emitter-followers 862, and buffers 864.

Sequencer 850 may be configured to generate N+2 pulses of a half master clock period, delayed one clock cycle apart. Thus, each phase signal may have a period of N+2 times the master clock period and a duty cycle of 50%/(N+2). In at least these embodiments, phases with duty cycles of 1/(N+2) (pulses of master clock cycle duration) may be generated by cascading N+2 flip-flops in a feedback loop. Further, performing an AND operation of each of phase with the master clock may generate a desired pulse duty cycle.

In some embodiments, each SAR path may be driven by N+2 phases, rotated in order between the N+2 paths. For example, the first phase in each path may drive a slave THA (e.g. slave THA 130; see FIG. 4). Further, for example, the second phase in each path may reset the SAR logic bits to 10 . . . 0. Moreover, for example, the third- N+2 phases in each path may clock each bit and set the next bit to "1", one phase after the other. A comparator latch (e.g., comparator 132; see FIG. 4) may be driven by a master clock signal (e.g., received via master clock 121). In some embodiments, to time a slave THA (e.g., slave THA 130; see FIG. 4) and a comparator latch (e.g., comparator 132; see FIG. 4) to increase the available clock frequency, variable delay circuits may be added, based on, for example, a fixed delay cell and/or a voltage controlled pulse interpolator.

Figure 14:
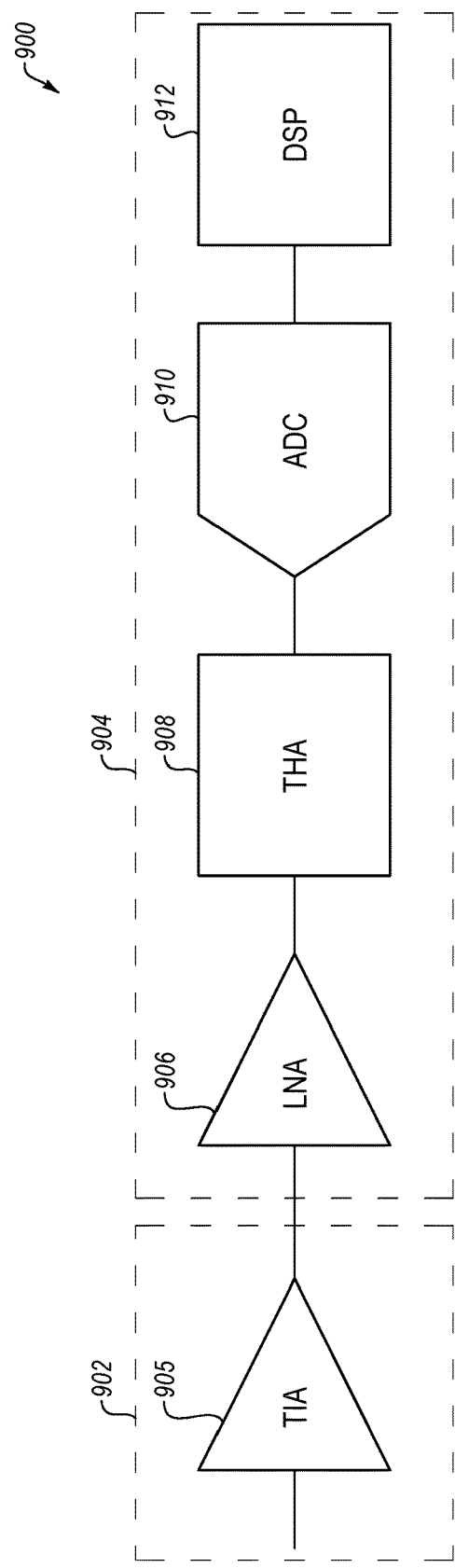
FIG. 14 illustrates is a block diagram depicting an optical transceiver.

FIG. 14 illustrates an example optical receiver 900 including electro-optics 902 and component 904. While optical receiver 900 is described in some detail below, it is described by way of illustration only, and not by way of limitation.

As illustrated, electro-optics 902 includes a transimpedance amplifier (TIA) 905. Component 904, which may include electronics (e.g., on a silicon chip), includes a low-noise linear amplifier buffer (LNA) 906, a THA 908, an ADC 910, and a digital signal processor 912. According to one embodiment, ADC 910 may include ADC 100 (see FIG. 1).

During a contemplated operation of optical receiver 900, TIA 905 may receive one or more current signals, and output one or more voltage signals to LNA 906. LNA 906 may linearly amplify the one or more voltage signals and convey an output to THA 908.

ADC 910 may receive an output of THA 908 and convert the received analog signal to a digital signal, for example, as described above with reference to FIGS. 1-13. The digital signal may be conveyed to digital signal processor 912, which may perform one or more processing operations.

Modifications, additions, or omissions may be made to FIG. 14 without departing from the scope of the present disclosure. For example, optical receiver 900 may include more or fewer elements than those illustrated and described in the present disclosure.

Figure 15:
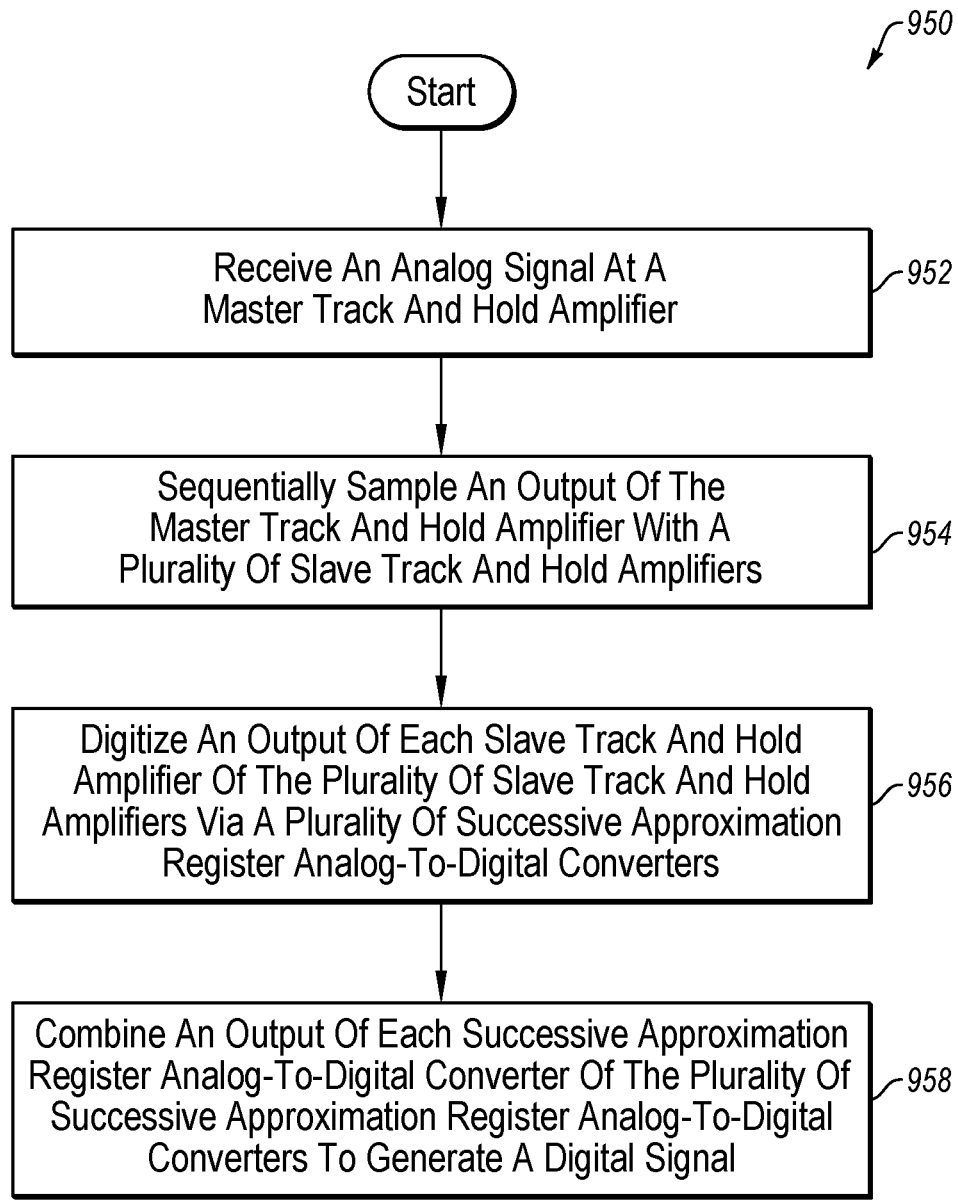
FIG. 15 is a flowchart illustrating an example method of converting an analog signal to a digital signal.

FIG. 15 is a flowchart of an example method 950 for converting an analog signal to a digital signal. Method 950 may be performed by any suitable system, apparatus, or device. For example, ADC 100 (see FIG. 1) or one or more of the components thereof may perform one or more of the operations associated with method 950. In these and other embodiments, program instructions stored on a computer readable medium may be executed to perform one or more of the operations of method 950.

At block 952, an analog signal may be received at a master THA, and method 950 may proceed to block 954. For example, master THA 102 (see FIG. 1) may receive an analog signal At block 954, an output of the master THA may be sampled by a plurality of slave THAs, and method 950 may proceed to block 956. For example, each slave THA 104 (see FIG. 1) may sequentially sample an output of master THA 102.

At block 956, an output of each slave THA of the plurality of slave THAs may be digitized via a plurality of SAR ADCs, and method 950 may proceed to block 958. For example, an output of each slave THA 104 may be received by an associated SAR ADC 108, which may output a digital signal.

At block 958, an output of each SAR ADC may be combined to generate a digital signal. For example, an output of each SAR ADC 108 may be combined to generate a digital signal, which represents the analog signal received at the master THA in a digital format.

Modifications, additions, or omissions may be made to method 950 without departing from the scope of the present disclosure. For example, the operations of method 950 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated. In the present disclosure, a "computing entity" may be any computing system as previously defined in the present disclosure, or any module or combination of modulates running on a computing system.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

All examples and conditional language recited in the present disclosure are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A device, comprising:
   a first track and hold amplifier (THA) configured to receive an analog input signal; and
   a plurality of paths coupled to an output of the first THA, each path of the plurality of paths including:
   a second THA coupled to the first THA; and
   a successive approximation register analog-to-digital converter (SAR ADC) coupled to an output of the second THA, the SAR ADC including:
   a comparator including an input coupled to an output of the second THA;
   a latch coupled to an output of the comparator;
   a SAR coupled to an output of the latch, the SAR comprising a plurality of cells, each cell of the plurality of cells including an emitter follower coupled to a settable and resettable latch; and
   a R-2R DAC coupled between an output of the SAR and another input of the comparator.

2. The device of claim 1, where the settable and resettable latch includes four-level bi-complementary metal-oxide-semiconductor (BiCMOS) quasi-current mode logic (CML), wherein two levels of the four-level BiCMOS quasi CML comprise one or more metal-oxide-semiconductor field-effect transistors (MOSFETs) and two levels of the four-level BiCMOS quasi CML comprise one or more heterojunction bipolar transistors (HBT).

3. The device of claim 1, further comprising a pulse generator including a sequencer configured to send one or more clock signals to each path of the plurality of paths.

4. The device of claim 3, the sequencer comprising:
   a plurality of resettable flip-flops; and
   a settable flip-flop coupled to the plurality of resettable flip-flops.

5. The device of claim 4, wherein the settable flip-flop includes a settable latch coupled to a latch.

6. The device of claim 5, wherein the settable latch includes three-level bi-complementary metal-oxide-semiconductor (BiCMOS) quasi-current mode logic (CML), wherein one level of the three-level BiCMOS quasi CML comprise one or more metal-oxide-semiconductor field-effect transistors (MOSFETs) and two levels of the three-level BiCMOS quasi CML comprise one or more heterojunction bipolar transistors (HBT).

7. The device of claim 4, wherein each resettable flip-flop of the plurality of resettable flip-flops includes a resettable latch coupled to a latch.

8. The device of claim 7, wherein the resettable latch includes three-level bi-complementary metal-oxide-semiconductor (BiCMOS) quasi-current mode logic (CML), wherein one level of the three-level BiCMOS quasi CML comprise one or more metal-oxide-semiconductor field-effect transistors (MOSFETs) and two levels of the three-level BiCMOS quasi CML comprise one or more heterojunction bipolar transistors (HBT).

9. The device of claim 1, wherein the first THA comprises:
   an emitter follower transistor coupled to each of an input and an output;
   a charging node coupled between the output and a voltage supply, the charging node further coupled to the input via the emitter follower transistor; and a cascode switch coupled to each of the input and the output and configured to:
   cause the emitter follower transistor to operate in a conductive state and charge the charging node during a track mode; and
   cause the emitter follower transistor to operate in a non-conductive state to isolate the charging node from the input during a hold mode.

10. The device of claim 9, the cascode switch comprising:
a first bipolar transistor coupled to the input;
a second bipolar transistor coupled to the output and the first bipolar transistor;
a first field-effect transistor (FET) coupled to the first bipolar transistor and configured to receive a hold signal during the hold mode; and
a second FET coupled to the second bipolar transistor and configured to receive a track signal during the track mode.

11. The device of claim 10, wherein a gate of the first FET is configured to receive a track signal to cause the first FET to operate in a conductive state during the track mode.

12. The device of claim 10, wherein a gate of the second FET is configured to receive a hold signal to cause the second FET to operate in a conductive state during the hold mode.

13. The device of claim 1, wherein the second THA comprises:
an input buffer;
an output buffer; and
a THA core coupled between the input buffer and the output buffer and comprising:
   an emitter follower transistor coupled to each of an input and an output;
   a charging node coupled between the output and a voltage supply, the charging node further coupled to the input via the emitter follower transistor; and
   a cascode switch coupled to each of the input and the output and configured to:
      cause the emitter follower transistor to operate in a conductive state and charge the charging node during a track mode; and
      cause the emitter follower transistor to operate in a non-conductive state to isolate the charging node from the input during a hold mode.

14. The device of claim 1, further comprising a pulse generator configured to convey a clock signal to the second THA and the SAR ADC in each path of the plurality of paths.

15. The device of claim 1, wherein the plurality of paths are configured to sequentially sample an output of the first THA.

16. The device of claim 1, further comprising:
a third first track and hold amplifier (THA) configured to receive the analog input signal; and
a second plurality of paths coupled to an output of the third THA, each path of the second plurality of paths including:
   a fourth THA coupled to the third THA; and
   a SAR ADC coupled to an output of the fourth THA.

17. The device of claim 1, wherein each path of the plurality of paths includes:
a first delay component configured to receive a phase signal and convey a delayed phase signal to the second THA; and
a second delay component configured to receive a master clock signal and convey a second delayed phase signal to a comparator of the associated path.

18. An optical receiver, comprising:
a processor; and
an analog-to-digital converter (ADC) coupled to the processor and including:
   a master track and hold amplifier (THA) configured to receive an analog input signal; and
   a plurality of paths coupled to an output of the master THA, the plurality of paths comprising N+2 paths, N being equal to a number of bits of the ADC, each path of the plurality of paths including:
      a slave THA coupled to the master THA; and
      a successive approximation register analog-to-digital converter (SAR ADC) coupled to an output of the slave THA, the SAR ADC including:
         a comparator including an input coupled to an output of the slave THA;
         a latch coupled to an output of the comparator;
         a SAR coupled to an output of the latch; and
         a R-2R DAC coupled between an output of the SAR and another input of the comparator.

19. The optical receiver of claim 18, wherein the master THA comprises:
an emitter follower transistor coupled to each of an input and an output;
a charging node coupled between the output and a voltage supply, the charging node further coupled to the input via the emitter follower transistor;
a cascode switch coupled to each of the input and the output and configured to:
   cause the emitter follower transistor to operate in a conductive state and charge the charging node during a track mode; and
   cause the emitter follower transistor to operate in a non-conductive state to isolate the charging node from the input during a hold mode.

20. The optical receiver of claim 18, wherein the slave THA comprises:
an input buffer;
an output buffer; and
a THA core coupled between the input buffer and the output buffer and comprising:
   an emitter follower transistor coupled to each of an input and an output;
   a charging node coupled between the output and a voltage supply, the charging node further coupled to the input via the emitter follower transistor; and
   a cascode switch coupled to each of the input and the output and configured to:
      cause the emitter follower transistor to operate in a conductive state and charge the charging node during a track mode; and
      cause the emitter follower transistor to operate in a non-conductive state to isolate the charging node from the input during a hold mode.

21. The optical receiver of claim 18, wherein the plurality of paths are configured to sequentially sample an output of the master THA.

22. A method, comprising:
receiving an analog signal at a master track and hold amplifier (THA);
generating the output of the master THA including:
   receiving the analog signal at an input of the master THA coupled to an emitter follower transistor;
   configuring a cascode switch to cause the emitter follower transistor to operate in a conductive state to couple the input to each of a charging node and an output during a track mode; and configuring the cascode switch to cause the emitter follower transistor to operate in a non-conductive state to isolate the input from each of the charging node and the output during a hold mode;

sequentially sampling an output of the master THA with a plurality of slave THAs;

digitizing an output of each slave THA of the plurality of slave THAs via a plurality of successive approximation register analog-to-digital converters (SAR ADC), wherein each SAR ADC of the plurality of SAR ADCs includes a comparator including an input coupled to an output of the second THA, a latch coupled to an output of the comparator, a SAR coupled to an output of the latch, and a R-2R DAC coupled between an output of the SAR and another input of the comparator; and combining an output of each SAR ADC of the plurality of SAR ADCs to generate a digital signal.

23. The method of claim 22, wherein sequentially sampling an output of the master THA with a plurality of slave THAs comprises receiving a different sample of the output of the master THA at each slave THA of the plurality of slave THAs.

24. The method of claim 22, further comprising generating the output of each slave THA including:

receiving a sample of the output of the master THA at an input coupled to an emitter follower transistor;

configuring a cascode switch to cause the emitter follower transistor to operate in a conductive state to couple the input to each of a charging node and an output during a track mode; and configuring the cascode switch to cause the emitter follower transistor to operate in a non-conductive state to isolate the input from each of the charging node and the output during a hold mode.

* * * * *